United States Patent
Rice et al.

(10) Patent No.: US 12,315,829 B2
(45) Date of Patent: May 27, 2025

(54) PACKAGED TRANSISTOR AMPLIFIERS THAT INCLUDE INTEGRATED PASSIVE DEVICE MATCHING STRUCTURES HAVING DISTRIBUTED SHUNT INDUCTANCES

(71) Applicant: MACOM Technology Solutions Holdings, Inc., Lowell, MA (US)

(72) Inventors: David Rice, Hollister, CA (US); Jeremy Fisher, Raleigh, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 881 days.

(21) Appl. No.: 17/340,492

(22) Filed: Jun. 7, 2021

(65) Prior Publication Data

US 2022/0392857 A1    Dec. 8, 2022

(51) Int. Cl.
| | | |
|---|---|---|
| H03F 3/191 | (2006.01) | |
| H01L 23/00 | (2006.01) | |
| H01L 23/66 | (2006.01) | |
| H01P 3/08 | (2006.01) | |
| H03F 3/195 | (2006.01) | |

(52) U.S. Cl.
CPC .............. H01L 23/66 (2013.01); H01L 24/48 (2013.01); H01P 3/081 (2013.01); H03F 3/195 (2013.01); H01L 2223/6655 (2013.01); H01L 2224/48175 (2013.01); H03F 2200/451 (2013.01)

(58) Field of Classification Search
CPC ........................................................ H03F 3/191
USPC .................................................. 330/302, 305
See application file for complete search history.

(56) References Cited

U.S. PATENT DOCUMENTS

| | | | | |
|---|---|---|---|---|
| 7,138,872 | B2* | 11/2006 | Blednov | ................. H03F 3/193 |
| | | | | 330/306 |
| 8,638,171 | B2* | 1/2014 | Blednov | ................. H03F 1/565 |
| | | | | 330/66 |
| 11,190,146 | B2* | 11/2021 | Srinidhi Embar | ...... H03F 1/565 |
| 11,367,696 | B2* | 6/2022 | Ward | ................... H01L 25/0655 |
| 2007/0007622 | A1 | 1/2007 | Liu et al. | |
| 2014/0191809 | A1 | 7/2014 | Kamiyama et al. | |
| 2015/0295548 | A1* | 10/2015 | Zhang | ....................... H03F 3/21 |
| | | | | 330/296 |
| 2019/0131937 | A1 | 5/2019 | Yoshioka et al. | |
| 2019/0296693 | A1 | 9/2019 | Ahmed et al. | |
| 2020/0358408 | A1 | 11/2020 | Miyazawa | |
| 2021/0313282 | A1* | 10/2021 | Noori | ..................... H03F 3/195 |
| 2021/0313286 | A1* | 10/2021 | Watts | ................. H01L 29/7786 |
| 2021/0399692 | A1* | 12/2021 | Chidurala | ............. H03F 1/0288 |
| 2021/0408978 | A1* | 12/2021 | Chidurala | ................. H03F 1/56 |

OTHER PUBLICATIONS

"PCT Search Report and Written Opinion in corresponding patent application No. PCTUS22030624 mailed Oct. 12, 2022, 17 pages".

* cited by examiner

*Primary Examiner* — Henry Choe
(74) *Attorney, Agent, or Firm* — Myers Bigel, P.A.

(57) ABSTRACT

A packaged RF transistor amplifier includes an RF transistor amplifier die having a first terminal, a first lead, an integrated passive device that includes a first series microstrip transmission line, a first bond wire coupled between the first terminal and the first series microstrip transmission line, and a second bond wire coupled between the first series microstrip transmission line and the first lead.

23 Claims, 12 Drawing Sheets

PACKAGED TRANSISTOR AMPLIFIERS THAT INCLUDE INTEGRATED PASSIVE DEVICE MATCHING STRUCTURES HAVING DISTRIBUTED SHUNT INDUCTANCES

FIELD

The present invention relates to microelectronic devices and, more particularly, to packaged radio frequency ("RF") transistor amplifiers.

BACKGROUND

Electrical circuits requiring high power handling capability while operating at high frequencies have become more prevalent. In particular, there is now high demand for RF transistor amplifiers that are used to amplify RF signals at frequencies of, for example, 500 MHz and higher. These RF transistor amplifiers often need to exhibit high reliability, good linearity and handle high output power levels.

RF transistor amplifiers may be implemented in silicon or wide bandgap semiconductor materials, such as silicon carbide ("SiC") and Group III nitride materials. Herein, the term "wide bandgap" refers to semiconductor materials having a bandgap of greater than 1.40 eV. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented as High Electron Mobility Transistors ("HEMT") and are primarily used in applications requiring high power and/or high frequency operation where LDMOS RF transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. When multiple RF transistor amplifier die are used, they may be connected in series and/or in parallel.

RF transistor amplifiers often include matching circuits, such as (1) impedance matching circuits that are designed to improve the impedance match (for RF signals at the fundamental operating frequency of the amplifier) between the RF transistor amplifier die and transmission lines connected thereto and (2) harmonic termination circuits that are designed to at least partly terminate harmonics that may be generated during device operation, such as second and third order harmonics or baseband intermodulation products. The RF transistor amplifier die(s) as well as the impedance matching and harmonic termination circuits may be enclosed in a package. Electrical leads may extend from the package to electrically connect the RF transistor amplifier to external circuit elements such as input and output RF transmission lines and bias voltage sources.

As noted above, Group III nitride-based RF transistor amplifiers are often used in high power and/or high frequency applications. Typically, high levels of heat are generated within a Group III nitride-based RF transistor amplifier die during operation. If the RF transistor amplifier die becomes too hot, its performance (e.g., output power, efficiency, linearity, gain, etc.) may deteriorate and/or the RF transistor amplifier die or other elements of the amplifier may be damaged. As such, Group III nitride-based RF transistor amplifiers are typically mounted in packages that may be optimized for heat removal.

SUMMARY

Pursuant to embodiments of the present invention, packaged RF transistor amplifiers are provided that include an RF transistor amplifier die having a first terminal, a first lead, an integrated passive device that includes a first series microstrip transmission line, a first bond wire coupled between the first terminal and the first series microstrip transmission line, and a second bond wire coupled between the first series microstrip transmission line and the first lead.

In some embodiments, the first bond wire, the first series microstrip transmission line and the second bond wire may comprise an electrical path between the first terminal and the first lead.

In some embodiments, the packaged RF transistor amplifier may further comprise a shunt LC circuit electrically connected between a bond pad on the integrated passive device and electrical ground. In some embodiments, the integrated passive device may further include a first shunt microstrip transmission line that is part of the shunt LC circuit and/or a capacitor that is part of the shunt LC circuit. In some embodiments, the packaged RF transistor amplifier further comprises a third bond wire that is electrically coupled in series with the first shunt microstrip transmission line.

In some embodiments, the first bond wire may extend in a first direction and the third bond wire may extend in a third direction that forms an oblique angle with the first direction.

In some embodiments, the oblique angle may be between 45° and 135°.

In some embodiments, the third bond wire crosses over the first series microstrip transmission line when the packaged RF transistor amplifier is viewed along an axis that extends perpendicular to an upper surface of the integrated passive device.

In some embodiments, the packaged RF transistor amplifier may further comprise a submount, and the RF transistor amplifier die may be mounted on an upper surface of the submount.

In some embodiments, the first series microstrip transmission line may be a first of a plurality of series microstrip transmission lines included in the integrated passive device, and the first shunt microstrip transmission line may be interposed between two of the series microstrip transmission lines.

In some embodiments, the packaged RF transistor amplifier may further comprise a plurality of third bond wires that are part of a shunt inductor-capacitor ("LC") circuit electrically connected between the first terminal and electrical ground, and the third bond wires may comprise at least half of a total inductance of the shunt LC circuit.

In some embodiments, the integrated passive device may further include a first shunt microstrip transmission line that is coupled between the first terminal and electrical ground.

In some embodiments, the integrated passive device further includes a second series microstrip transmission line, and the first shunt microstrip transmission line is between the first series microstrip transmission line and the second series microstrip transmission line.

In some embodiments, the integrated passive device may be interposed between the RF transistor amplifier die and the first lead.

In some embodiments, the packaged RF transistor amplifier may further comprise a package, and the RF transistor amplifier die and the integrated passive device may be within the package, and the first lead may extend from an interior of the package to outside the package.

In some embodiments, the first lead may be an output lead.

Pursuant to embodiments of the present invention, packaged RF transistor amplifiers are provided that include an RF transistor amplifier die having a first terminal, a first lead, a capacitor having a first electrode and a second electrode, and an integrated passive device that includes a first series transmission line that forms part of an electrical path between the first terminal and the first lead.

In some embodiments, the integrated passive device further includes a first shunt microstrip transmission line that is electrically coupled between the first terminal and the first electrode of the capacitor.

In some embodiments, the electrical path further comprises a first bond wire that couples the first terminal to the first series transmission line and a second bond wire that couples the first series transmission line to the first lead.

In some embodiments, the second electrode may be coupled to electrical ground.

In some embodiments, the packaged RF transistor amplifier may further comprise a third bond wire that is electrically coupled in series with the first shunt microstrip transmission line.

In some embodiments, the first bond wire may extend in a first direction and the third bond wire may extend in a third direction that forms an oblique angle with the first direction.

In some embodiments, the third bond wire crosses over the first series microstrip transmission line when the packaged RF transistor amplifier is viewed along an axis that extends perpendicular to an upper surface of the integrated passive device.

In some embodiments, the first series microstrip transmission line may be a first of a plurality of series microstrip transmission lines included in the integrated passive device, and the first shunt microstrip transmission line may be interposed between two of the series microstrip transmission lines.

In some embodiments, the packaged RF transistor amplifier may further comprise a package, and the RF transistor amplifier die and the integrated passive device may be within the package, and the first lead may extend from an interior of the package to outside the package.

In some embodiments, the first lead may be an output lead, and the first terminal comprises a drain terminal, and the capacitor may be mounted on the integrated passive device.

Pursuant to embodiments of the present invention, packaged RF transistor amplifiers are provided that include an RF transistor amplifier die having a first terminal, a first lead, an integrated passive device that includes a first series transmission line, and a third bond wire that crosses over the first series transmission line when the packaged RF transistor amplifier is viewed along an axis that extends perpendicular to an upper surface of the integrated passive device, where the first series transmission line electrically connects the first terminal to the first lead.

In some embodiments, opposed first and second ends of the third bond wire may be bonded to an upper surface of the integrated passive device.

In some embodiments, the packaged RF transistor amplifier may further comprise a first shunt transmission line that is electrically coupled in series with the third bond wire.

In some embodiments, the packaged RF transistor amplifier may further comprise a capacitor that is electrically coupled in series with the third bond wire.

In some embodiments, the first shunt transmission line, the third bond wire and the capacitor may form a shunt LC circuit electrically connected between a bond pad on the integrated passive device and electrical ground.

In some embodiments, the capacitor may be mounted on or formed in the integrated passive device.

In some embodiments, the packaged RF transistor amplifier may further comprise a first bond wire that couples the first terminal to the first series transmission line and a second bond wire that couples the first series transmission line to the first lead, where the first bond wire extends in a first direction and the third bond wire extends in a third direction that forms an angle of between 45° and 135° with the first direction.

In some embodiments, the packaged RF transistor amplifier may further comprise a submount, where the RF transistor amplifier die is mounted on an upper surface of the submount, the first lead comprises an output lead, and the first terminal comprises a drain terminal, and the integrated passive device may be interposed between the RF transistor amplifier die and the output lead.

In some embodiments, the first series transmission line may be a first of a plurality of series transmission lines included in the integrated passive device, and the first shunt transmission line may be interposed between two of the series transmission lines.

Pursuant to embodiments of the present invention, packaged RF transistor amplifiers are provided that include an RF transistor amplifier die having a first terminal, a first lead, an integrated passive device that is interposed between the RF transistor amplifier die and the first lead, a first bond wire that extends between the first terminal and the integrated passive device, and a third bond wire that has first and second ends that are mounted on the integrated passive device.

In some embodiments, the first bond wire may extend in a first direction and the third bond wire may extend in a third direction that forms an oblique angle with the first direction.

In some embodiments, the packaged RF transistor amplifier may further comprise a second bond wire that that extends between the first series transmission line and the first lead.

In some embodiments, the integrated passive device further includes a first shunt transmission line that is coupled to the third bond wire.

In some embodiments, the integrated passive device further includes a capacitor, and wherein the first shunt transmission line, the third bond wire and the capacitor form a shunt LC circuit that is coupled to electrical ground.

In some embodiments, the integrated passive dev ice further includes a first series transmission line, and the third bond wire crosses over the first series transmission line when the packaged RF transistor amplifier is viewed along an axis that extends perpendicular to an upper surface of the integrated passive device.

In some embodiments, the first series transmission line may be a first of a plurality of series transmission lines included in the integrated passive device, and the first shunt transmission line may be interposed between two of the series transmission lines.

DETAILED DESCRIPTION

Pursuant to embodiments of the present invention, packaged RF transistor amplifiers are provided that include an RF transistor amplifier die and an integrated passive device that includes impedance matching circuitry. The impedance matching circuitry may be configured, for example, to match the impedance of RF signals at the fundamental operating frequency of the amplifier that are output by the amplifier to the impedance of an output lead of the packaged RF transistor amplifier. The impedance matching networks in the packaged RF transistor amplifiers according to embodiments of the present invention may have distributed shunt inductances that may reduce the amount of bond wire material (e.g., length, cross-sectional area, etc.) required to connect the RF transistor amplifier die to the output lead of the package, and which may also reduce the heat generated in the bond wires when the amplifier is operated at high output power levels.

Various applications now require packaged RF transistor amplifiers that operate at very high output power levels. Packaged RF transistor amplifiers typically include an RF input lead which receives an RF input signal and an RF output lead which outputs RF signals that have been amplified by the RF transistor amplifier die. When the RF transistor amplifier die is implemented as a field effect transistor, the RF input lead may be coupled to the gate terminal of the transistor and the RF output lead may be coupled to the drain terminal of the transistor. The impedance of RF signals at the fundamental operating frequency of the RF transistor amplifier that are passed to the input lead often does not match the impedance at the gate terminal of the RF transistor amplifier and/or the impedance, at the fundamental operating frequency of the RF transistor amplifier, of RF signals output by the RF transistor amplifier will not match the impedance of the RF output lead. Thus, packaged RF transistor amplifiers may include input impedance matching circuits that are configured to improve the impedance match between the input lead and the gate terminal and/or output impedance matching circuits that are configured to improve the impedance match between the drain terminal and the output lead.

Figure 1A:
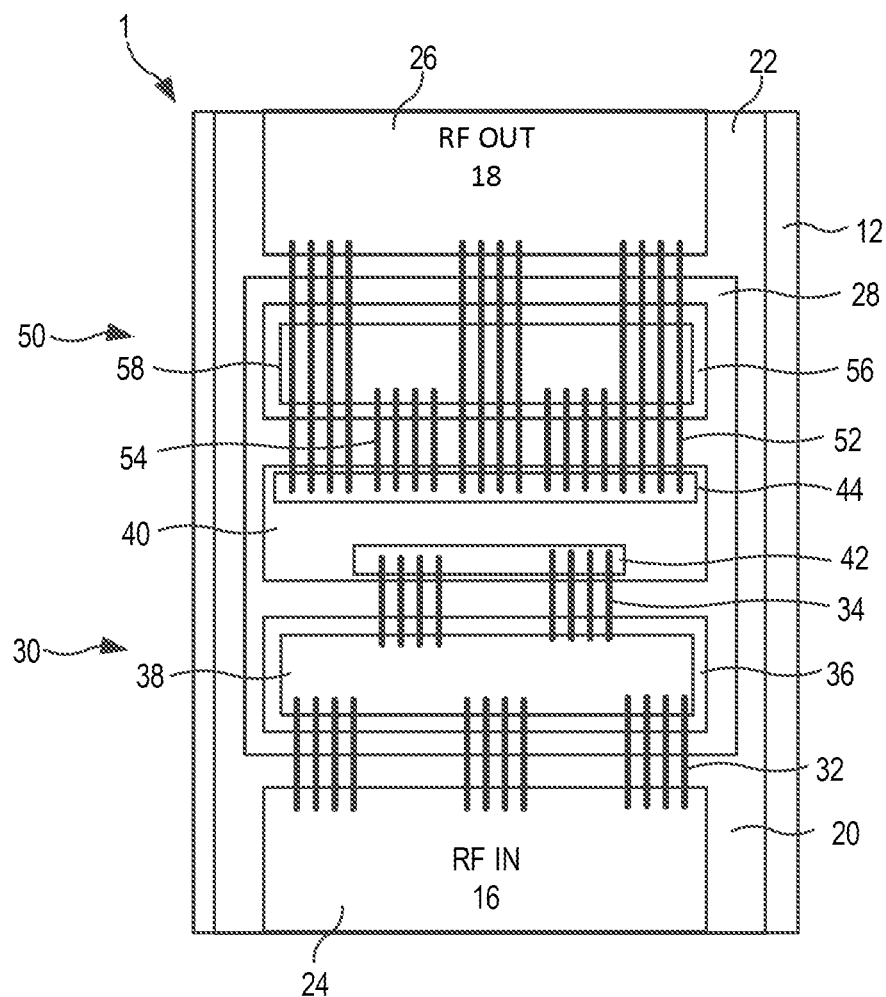
FIG. 1A is a schematic plan view of a conventional packaged RF transistor amplifier with a lid thereof removed.
Figure 1B:
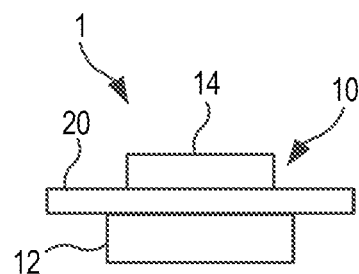
FIG. 1B is a schematic side view of the packaged RF transistor amplifier of FIG. 1A.

FIG. 1A is a schematic plan view of a conventional packaged RF transistor amplifier 1 with a lid 14 of the package thereof removed. FIG. 1B is a schematic side view of the RF transistor amplifier 1 with the lid 14 in place. As shown in FIGS. 1A and 1B, the RF transistor amplifier 1 may include a submount 12, a printed circuit board 20 that is mounted on an upper surface of the submount 12, and the lid 14 that is mounted to cover an upper surface of the printed circuit board 20. The submount 12, printed circuit board 20 and lid 14 may comprise the package 10 of the RF transistor amplifier 1.

Referring to FIG. 1A, the printed circuit board 20 comprises a dielectric substrate 22 that has first and second metallized regions 24, 26 on an upper surface thereof. The first metallized region 24 forms an RF input lead 16 of RF transistor amplifier 1, and the second metallized region 26 forms an RF output lead 18 of the RF transistor amplifier 1. A bottom surface of the printed circuit board 20 may also include one or more metallized regions (not shown) that may, in combination with the dielectric substrate 22 and the first and second metallized regions 24, 26, form microstrip transmission lines. The printed circuit board 20 further includes an interior opening 28 that exposes the upper surface of the submount 12.

An RF transistor amplifier die 40 is mounted on the submount 12 within the interior opening 28 in the printed circuit board 20. RF transistor amplifier die 40 includes an RF input terminal 42 (e.g., a gate terminal) and an RF output terminal 44 (e.g., a drain terminal).

The RF transistor amplifier 1 further includes an input impedance matching network 30 that comprises a set of first bond wires 32, a set of second bond wires 34 and an input impedance matching capacitor die 36 that includes one or more capacitors 38. First ends of the first bond wires 32 are coupled to the RF input lead 16 and second ends of the first bond wires 32 are coupled to upper electrodes of the one or more capacitors 38 that are included in the input impedance matching capacitor die 36. The lower electrode(s) of the capacitor(s) 38 included in the input impedance matching capacitor die 36 are coupled to electrical ground via a connection that is not visible in FIG. 1A. The input impedance matching capacitor die 36 may comprise a MOSCAP die, which refers to a capacitor die formed using semiconductor processing techniques. A typical MOSCAP die may comprise a heavily-doped semiconductor body (e.g., silicon or silicon carbide) that acts as a lower electrode, an insulating layer on the upper surface of the semiconductor body (e.g., a silicon dioxide layer), and an upper electrode in the form of a heavily-doped semiconductor layer (e.g., silicon or silicon carbide) on the upper surface of the insulating layer. The set of second bond wires 34 extend between the upper electrodes of the capacitors 38 and the RF input terminal 42 of the RF transistor amplifier 40. The sets of first and third bond wires 32, 34 act as series inductances that are interposed between the RF input lead 16 and the RF input terminal 42 of the RF transistor amplifier 40. The input impedance matching capacitor die 36 acts as a shunt capacitor to electrical ground that is interposed between the two series inductances 32, 34.

The RF transistor amplifier 1 also includes an output impedance matching network 50 that comprises a set of third bond wires 52, a set of fourth bond wires 54 and an output impedance matching capacitor die 56 having one or more capacitors 58. The set of third bond wires 52 extend between the drain terminal 44 of the RF transistor amplifier die 40 and the RF output lead 18. The set of fourth bond wires 54 extend between the drain terminal 44 of the RF amplifier die 40 and the upper electrodes of the one or more capacitors 58 that are included in the output impedance matching capacitor die 56. The lower electrode(s) of the capacitor(s) 58 included in the output impedance matching capacitor die 56 are coupled to electrical ground via a connection that is not visible in FIG. 1A. The output impedance matching capacitor die 56 may also comprise a MOSCAP die. The set of third bond wires 52 act as a series inductance that is interposed between the drain terminal 44 of the RF amplifier die 40 and the RF output lead 18. The fourth set of bond wires 54 and the impedance matching capacitor die 56 act as a shunt inductor-capacitor ("LC")circuit to electrical ground.

Unfortunately, the set of fourth bond wires 54 in the conventional packaged RF transistor amplifier 1 may become excessively hot during high power operation of the RF transistor amplifier 1. This is particularly true if the packaged RF transistor amplifier is configured to operate in frequency bands that are at relatively lower frequencies, such as frequencies below 2.7 GHz, because the required amount of shunt inductance typically increases with decreasing frequency. If the fourth bond wires 54 become too hot, they can actually melt and destroy the device.

Pursuant to embodiments of the present invention, packaged RF transistor amplifiers are provided that have distributed shunt inductances. In some embodiments, these packaged RF transistor amplifiers may include an integrated passive device that has one or more shunt capacitances mounted thereon or integrated therein. The integrated passive device may also include both "series" and "shunt" RF transmission lines. The "series" RF transmission lines may be part of an electrical connection between a terminal of the RF transistor amplifier die and a lead of the package. The "shunt" RF transmission lines may be part of a shunt electrical connection to electrical ground. The series electrical connection may comprise a set of first bond wires that extend between the terminal of the RF transistor amplifier die and the integrated passive device, the series RF transmission lines, and a set of second bond wires that extend between the integrated passive device and the lead of the package. The shunt electrical connection may comprise the set of first bond wires that extend between the terminal of the RF transistor amplifier die and the integrated passive device, the shunt RF transmission lines, and a set of third bond wires that extend between the shunt RF transmission lines and the capacitor(s) of the integrated passive device (which are coupled to electrical ground). In other embodiments, the shunt RF transmission line(s) may be omitted or may be replaced with a series RF transmission line(s).

In some embodiments, the integrated passive device may be part of an output impedance matching network of the packaged RF transistor amplifier. In such embodiments, the set of first bond wires may connect to a drain terminal of the RF transistor amplifier die, and the set of second bond wires may connect to an RF output lead of the device. In such embodiments, the integrated passive device may be mounted between the RF transistor amplifier die and the RF output lead. The integrated passive device may include a first series microstrip transmission line. A first bond wire may be coupled between the first terminal and the first series microstrip transmission line and a second bond wire may be coupled between the first series microstrip transmission line and the first lead. The first bond wire, the first series RF transmission line and the second bond wire may comprise an electrical path between the first terminal and the first lead. Additionally, the packaged RF transistor amplifier may also include a shunt LC circuit between a bond pad on the integrated passive device and electrical ground. The shunt LC circuit may include a first shunt RF transmission line, a capacitor and a third bond wire that are electrically coupled in series. The shunt LC circuit may be implemented in and/or on the integrated passive device.

In further embodiments, packaged RF transistor amplifiers are provided that comprise an RF transistor amplifier die having a first terminal (e.g., a drain terminal), a first lead (e.g., an output lead), a capacitor, and an integrated passive device that includes a first series transmission line that forms part of an electrical path between the first terminal and the first lead.

In some embodiments, the integrated passive device further includes a first shunt transmission line that is electrically coupled between the first terminal and the first electrode of the capacitor and/or a third bond wire that is electrically coupled in series with the capacitor. The second electrode of the capacitor may be coupled to electrical ground. The electrical path between the first terminal and the first lead may further include a first bond wire that couples the first terminal to the first series transmission line and a second bond wire that couples the first series transmission line to the first lead. The first series transmission line may be a first of a plurality of series transmission lines included in the integrated passive device, and the first shunt transmission line may be interposed between two of the series microstrip transmission lines.

In still other embodiments, packaged RF transistor amplifiers are provided that include an RF transistor amplifier die having a drain terminal, an output lead, an integrated passive device that includes a first series transmission line that electrically connects the drain terminal to the output lead, and a third bond wire that crosses over the first series transmission line when the packaged RF transistor amplifier is viewed along an axis that extends perpendicular to an upper surface of the integrated passive device. Opposed first and second ends of the third bond wire may be bonded to an upper surface of the integrated passive device. The integrated passive device may further include a first shunt transmission line that is electrically coupled in series with the third bond wire. A capacitor may be mounted on or formed in the integrated passive device. This capacitor may be electrically coupled in series with the third bond wire. The first shunt transmission line, the third bond wire and the capacitor may form a shunt LC circuit between a bond pad on the integrated passive device and electrical ground.

In still other embodiments, packaged RF transistor amplifiers are provided that comprise an RF transistor amplifier die having a first terminal, a first lead, an integrated passive device that is interposed between the RF transistor amplifier die and the first lead, a first bond wire that extends between the first terminal and the integrated passive device, and a third bond wire that has first and second ends that are mounted on the integrated passive device. In some embodiments, the first bond wire extends in a first direction and the third bond wire extends in a third direction that forms an oblique angle with the first direction.

Example embodiments of the present invention will now be discussed in further detail with reference to FIGS. 2A-7C.

Figure 2A:
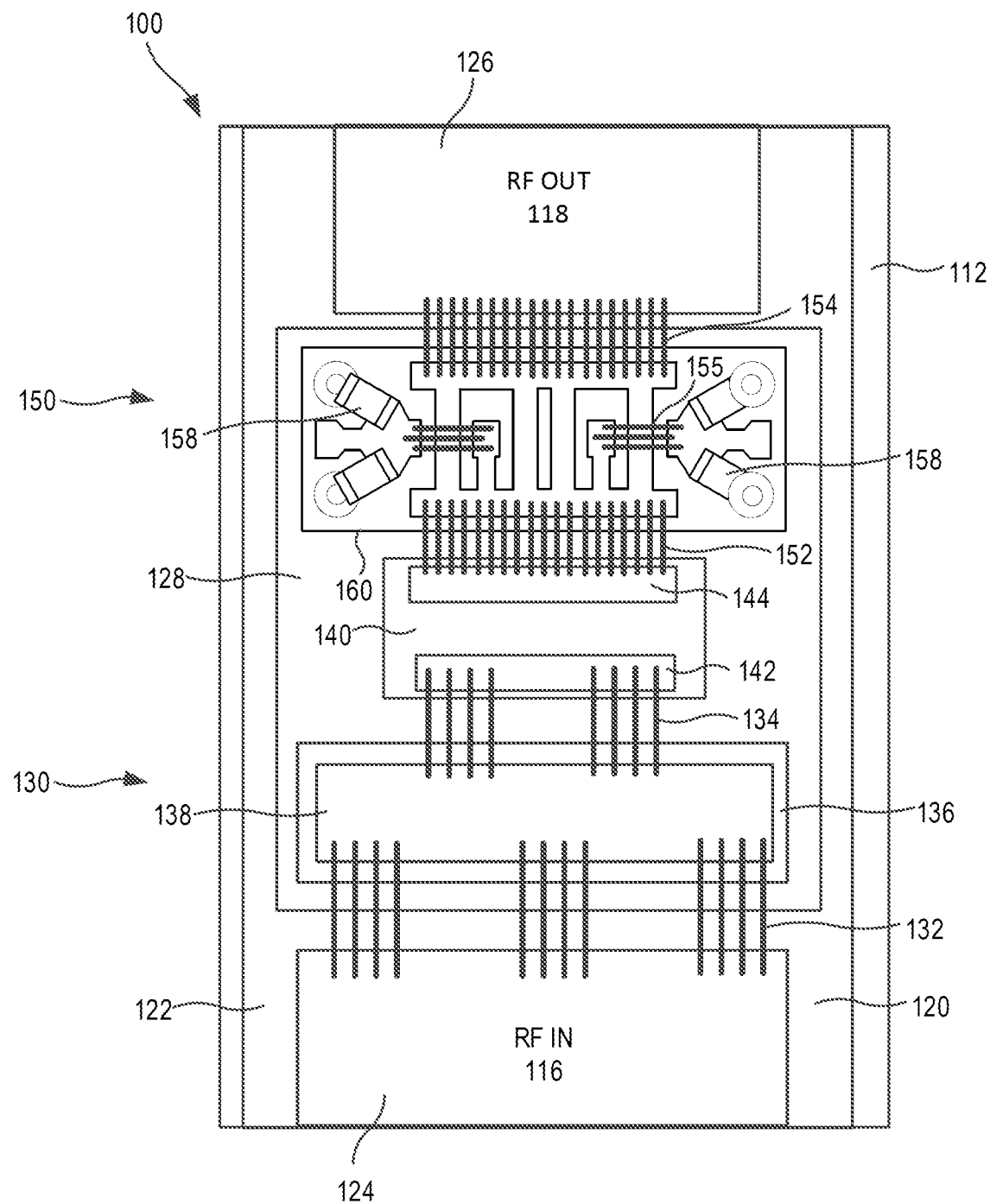
FIG. 2A is a schematic plan view of a packaged RF transistor amplifier according to embodiments of the present invention.
Figure 2B:
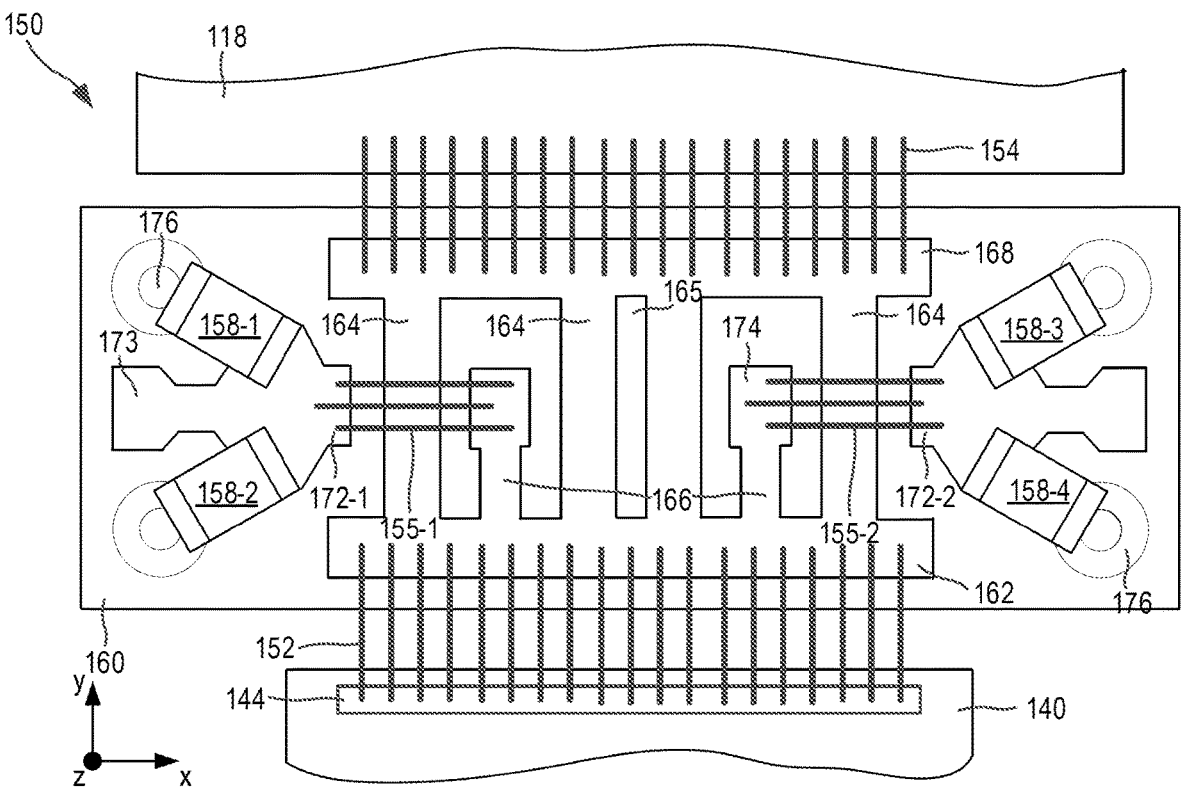
FIG. 2B is an enlarged view of a portion of the packaged RF transistor amplifier of FIG. 2A.
Figure 2C:
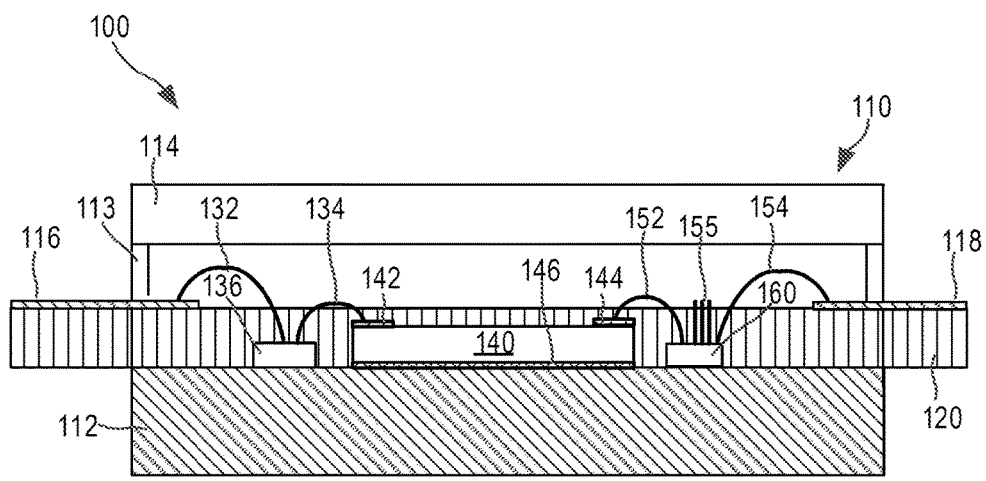
FIG. 2C is a schematic cross-sectional view of the packaged RF transistor amplifier of FIG. 2A

FIG. 2A is a schematic plan view of a packaged RF transistor amplifier 100 according to embodiments of the present invention. FIG. 2B is an enlarged view of an output portion of the packaged RF transistor amplifier 100 of FIG. 2A. FIG. 2C is a schematic cross-sectional view of the packaged RF transistor amplifier 100 of FIG. 2A.

Referring to FIG. 2C, the packaged RF transistor amplifier 100 includes a package 110 having various RF circuit elements (described below) mounted therein. The package 110 includes a submount 112, a sidewall structure 113, a lid 114, an RF input lead 116, an RF output lead 118 and a printed circuit board 120.

The submount 112 may comprise, for example, a flange or plate that may be formed of, for example, metal or a ceramic block that has metal vias or a metal slug formed therein. The submount 112 may include materials configured to assist with the thermal management of the package 110. For example, the submount 112 may include copper and/or molybdenum. In some embodiments, the submount 112 may be composed of multiple layers. In an example embodiment, the submount 112 may be a multilayer copper/molybdenum/copper metal flange that comprises a core molybdenum layer with copper cladding layers on either major surface thereof. In some embodiments, the submount 112 may include a metal heat sink that is part of a lead frame or metal slug. The lid 114 may be formed of or include an insulating material in some embodiments. For example, the lid 114 may be formed of or include ceramic materials. In some embodiments, the lid 114 may be formed of, for example, $Al_2O_3$. The sidewall structure 113 is interposed between the submount 112 and the lid 114. The lid 114 may be glued to the sidewall structure 113 using an epoxy glue. The sidewall structure 113 may be attached to the submount 112 via, for example, brazing. The RF input lead 116 and the RF output lead 118 may be configured to extend through the sidewalls 113, though embodiments of the present invention are not limited thereto.

The printed circuit board 120 is mounted on an upper surface of the submount 112. The RF input lead 116 and the RF output lead 118 may be implemented as metallized regions on the printed circuit board 120 in some embodiments.

Referring to FIG. 2A, the printed circuit board 120 comprises a dielectric substrate 122 that has first and second metallized regions 124, 126 on the upper surface thereof. The first metallized region 124 forms an RF input lead 116 of RF transistor amplifier 100, and the second metallized region 126 forms an RF output lead 118 of the RF transistor amplifier 100. A bottom surface of the printed circuit board 120 may also include one or more metallized regions (not shown) that form a ground plane. This ground plane may, in combination with the dielectric substrate 122 and the first and second metallized regions 124, 126, form input and output microstrip transmission lines. Alternatively, if the submount 112 is a metal submount, the submount 112 may serve as the ground plane for the input and output microstrip transmission lines. The printed circuit board 120 includes an interior opening 128 that exposes the upper surface of the submount 112.

An RF transistor amplifier die 140 is mounted on the submount 112 within the interior opening 128 in the printed circuit board 120. RF transistor amplifier die 140 includes an RF input terminal 142 (e.g., a gate terminal) and an RF output terminal 144 (e.g., a drain terminal).

The RF transistor amplifier 100 further includes an input impedance matching network 130 that comprises a set of first bond wires 132, a set of second bond wires 134 and an input impedance matching capacitor die 136 that includes one or more capacitors 138. The input impedance matching network 130 may be identical to the input impedance matching network 30 of the conventional RF transistor amplifier 1 discussed above with reference to FIGS. 1A-1B, and hence further description thereof will be omitted. It will be appreciated, however, that the input impedance matching network 130 may have any appropriate design, or may be omitted. It will also be appreciated that an input harmonic termination circuit (not shown) may be included in RF transistor amplifier 100 that is configured to terminate one or more higher order harmonics (e.g., second and/or third harmonics) to ground.

The RF transistor amplifier 100 includes an output impedance matching network 150. The output impedance matching network 150 may raise a low impedance at the output terminal 144 of the RF transistor amplifier die 140 to match a higher impedance seen at the RF output lead 118. The output impedance matching network 150 comprises a set of third bond wires 152, a set of fourth bond wires 154, a set of fifth bond wires 155 and an integrated passive device 160. An integrated passive device refers to a dielectric substrate that has passive electrical components formed thereon and/or therein. An integrated passive device may be fabricated, for example, using standard wafer fabrication technologies such as thin film and photolithography processing. Integrated passive devices may alternatively be fabricated using other techniques. For example, integrated passive devices may be fabricated using printed circuit board fabrication techniques. The dielectric substrate(s) of an integrated passive device may comprise, for example, thin film substrates such as silicon, alumina, glass, or standard printed circuit board dielectric materials. Integrated passive devices may have conductive wiring structures such as RF transmission lines, capacitors, inductors and/or other passive electrical components or structures formed on or in the device. Electrical components such as lumped element capacitors, inductors, resistors, and the like may also be mounted on an integrated passive device. Integrated passive devices may be free of any active electrical components in some embodiments. Integrated passive devices can be designed as flip chip mountable or wire bondable components.

As shown in FIG. 2A, the integrated passive device 160 may be mounted on the upper surface of the submount 112 and may be positioned between the RF transistor amplifier die 140 and the RF output lead 118. In an example embodiment, the integrated passive device 160 may comprise a three layer structure having a conductive bottom layer (e.g., doped polysilicon or metal), a dielectric substrate (e.g., FR4, RF printed circuit board dielectrics, alumina) on an upper surface of the conductive bottom layer, and a conductive top layer (e.g., doped polysilicon or metal) on an upper surface of the dielectric substrate. Lumped element capacitors 158 are mounted on an upper surface of the integrated passive device 160.

FIG. 2B is an enlarged view of the portion of FIG. 2A that includes the output impedance matching network 150 (including the integrated passive device 160). As shown in FIG. 2B, the conductive top layer of integrated passive device 160 includes a first bond pad 162, a plurality of series RF transmission lines 164, a plurality of shunt RF transmission lines 166, a second bond pad 168, a pair of third bond pads 172, and four conductive vias 176. The top conductive layer may comprise, for example, a metal pattern that covers portions of the top surface of the dielectric substrate while leaving other portions of the top layer of the dielectric substrate exposed.

The set of third bond wires 152 extend between the drain terminal 144 of the RF amplifier die 140 and the first bond pad 162. The third bond wires 152 may have relatively short lengths, as will be explained below. The set of fourth bond wires 154 extend between the second bond pad 168 and the RF output lead 118. The fourth bond wires 154 may also have relatively short lengths, as will be explained below. The series RF transmission lines 164 electrically connect the first bond pad 162 to the second bond pad 168. The RF transmission lines 164 are referred to herein as "series" RF transmission lines because, in conjunction with the third bond wires 152 and the fourth bond wires 154, they implement a plurality of series electrical connections between the drain terminal 144 of the RF transistor amplifier die 140 and the RF output lead 118. As shown, multiple series RF transmission lines 164 may be provided which are electrically connected in parallel to each other. It will also be appreciated that numerous other implementations of the series RF transmission lines 164 could be used. As one example, the region labeled 165 in FIG. 2B (which is an exposed portion of the dielectric substrate of the integrated passive device 160) could be metalized (or have some other conductive material formed thereon) in other embodiments, which would convert the two series RF transmission lines 164 that are between the two shunt RF transmission lines 166 into one large series RF transmission line 164.

Each shunt RF transmission line 166 is connected to the first bond pad 162. A distal end of each shunt RF transmission line 166 may serve as a bond pad 174, and may be widened in some embodiments to provide additional room for wire bonding. The series RF transmission lines 164 and the shunt RF transmission lines 166 may each be implemented as microstrip transmission lines. In some embodiments, additional structures may be formed in the integrated passive device 160 such as ground planes in the conductive top layer and/or conductive ground vias so that the series RF transmission lines 164 and/or the shunt RF transmission lines 166 have a coplanar waveguide or grounded coplanar waveguide configuration (which herein are considered to be specific types of microstrip transmission lines). At least one of the shunt RF transmission lines 166 may be interposed between a pair of the series RF transmission line 164.

The bond pads 174 formed at the end of each shunt transmission line 166 may be connected to a respective one of the third bond pads 172 by respective sets of fifth bond wires 155. The third bond wires 152 may extend in a first direction (the y-direction in FIG. 2B) and the fifth bond wires 155 may extend in a second direction (the x-direction in FIG. 2B) that is different from the first direction. In some embodiments, the first and second directions may intersect at an oblique angle. For example, in the depicted embodiment, the first and second directions may intersect at a 90° angle. In example embodiments, the first and second directions may intersect at an angle between 90°-135°. As is also shown in FIG. 2B, in some embodiments, at least some of the fifth bond wires 155 may cross over one (or more) of the first series RF transmission lines 164 when the packaged RF transistor amplifier 100 is viewed along an axis that extends perpendicular to an upper surface of the integrated passive device 160 (i.e., an axis along the z-direction in FIG. 2B that intersects the integrated passive device 160 at a 90° angle). Each third bond pad 172-1, 172-2 may be electrically connected to first electrodes of a respective pair of the capacitors 158. Here, third bond pad 172-1 is electrically connected to the first electrodes of capacitors 158-1 and 158-2, and third bond pad 172-2 is electrically connected to the first electrodes of capacitors 158-3 and 158-4. The second electrode of each capacitor 158 may be connected to a respective one of the conductive vias 176. The conductive vias 176 may electrically connect the second electrode of each capacitor 158 to a ground plane on the lower surface of the integrated passive device 160 to provide an electrical connection to ground.

Each third bond pad 172 includes a lateral extension 173 that may serve as a separate bond pad. A baseband capacitor can be bonded to the lateral extension 173, as can any other off-chip components, as needed. The lateral extension may alternatively be used to provide a supplemental bias current, if needed.

Figure 3A:
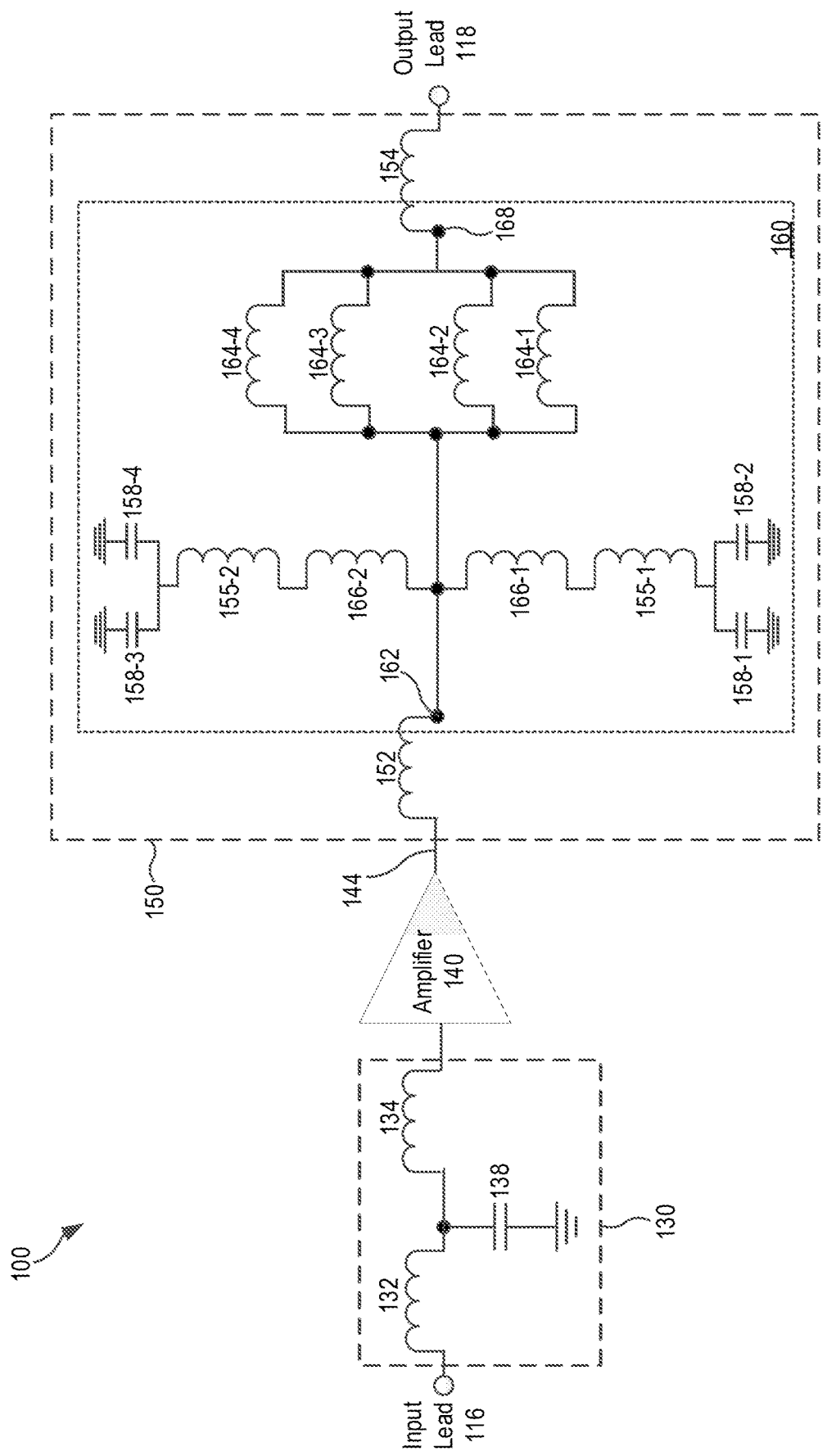
FIG. 3A is a circuit diagram for the packaged RF transistor amplifier of FIG. 2A.
Figure 3B:
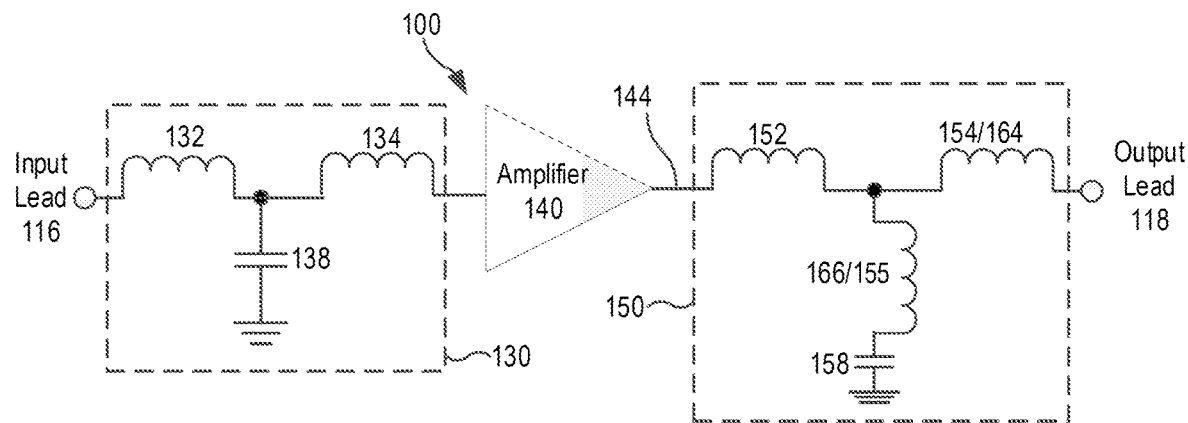
FIG. 3B is a simplified equivalent circuit diagram corresponding to the circuit diagram of FIG. 3A.

FIG. 3A is a circuit diagram of the packaged RF transistor amplifier 100 of FIGS. 2A-2C. As shown in FIG. 3A, the output impedance matching network 150 is coupled to the drain terminal 144 of the RF transistor amplifier die 140. The set of third bond wires 152, the four series RF transmission lines 164-1 through 164-4 and the set of fourth bond wires 154 comprise an RF transmission path that connects the drain terminal 144 to the RF output lead 118. The set of third bond wires 152, the shunt RF transmission lines 166 and the capacitors 158 comprise a shunt path that is connected between the drain terminal 144 and electrical ground. FIG. 3B is a simplified equivalent circuit diagram corresponding to the circuit of FIG. 3A.

As can be seen from FIGS. 3A-3B, a total of three inductances are interposed on the electrical path extending between the drain terminal 144 of the RF transistor amplifier die 140 and electrical ground, namely, the set of third bond wires 152, the shunt RF transmission lines 166 and the set of fifth bond wires 155. Thus, whereas the conventional RF transistor amplifier 1 of FIGS. 1A-1B included a single inductance along the shunt LC path to ground, the RF transistor amplifier 100 according to embodiments of the present invention includes three separate inductances. Thus, the inductance "L" of the shunt LC circuit included in the output impedance matching circuit 150 comprises a distributed series inductance.

The total inductance of the shunt LC path may be distributed amongst the third bond wires 152, the shunt RF transmission lines 166 and the fifth bond wires 155 in variety of ways. Typically, the shunt RF transmission lines 166 will provide the smallest contribution to the total inductance because they may be more susceptible to damage from overheating. In example embodiments, the shunt RF transmission lines 166 may provide less than 25%, less than 20%, less than 15% or less than 10% of the total inductance of the shunt LC path. The fifth bond wires 155 may be designed to provide the largest contribution to the total shunt inductance, as they may be located relatively far from the input impedance matching circuit 130 and hence may advantageously couple less therewith, as will be discussed in further detail below. In example embodiments, the fifth bond wires 155 may provide at least 40%, at least 50%, at least 60% or at least 70% of the total inductance. The third bond wires 152 may be designed to provide the second largest contribution to the total shunt inductance and, in example embodiments, may provide between 15% and 35% the total inductance of the shunt LC path.

In some embodiments, the fifth bond wires 155 may be adjusted as necessary to tune the total amount of inductance provided along the shunt LC path. For example, the number of fifth bond wires 155 and/or the length and/or size (e.g., cross-sectional area) of the fifth bond wires 155 may be adjusted to tune the output impedance matching network 150. Such tuning may be necessary, for example, to compensate for lot-to-lot and/or wafer-to-wafer variabilities in the RF performance of the RF transistor amplifier 100. For example, during the production process, a resonant frequency of the output impedance match to a particular RF transistor amplifier die 140 may be measured using a network analyzer. Characteristics (e.g., the length) of the fifth bond wires 155 may then be set in order to tune the resonant frequency of the RF transistor amplifier die 140 to a desired value, and the fifth bond wires 155 may be wire bonded in place. Moreover, many RF transistor amplifiers may be capable of operating over a wider frequency band than a desired operating frequency band. The amount of inductance along the shunt LC path may be adjusted based on the desired operating frequency band. For example, the fifth bond wires 155 may have a first length if the RF transistor amplifier 100 is to be configured to operate in the 1805-1870 MHz frequency band, and may have a second length if the RF transistor amplifier 100 is to be configured to operate in the 2110-2170 MHz frequency band.

Figure 4A:
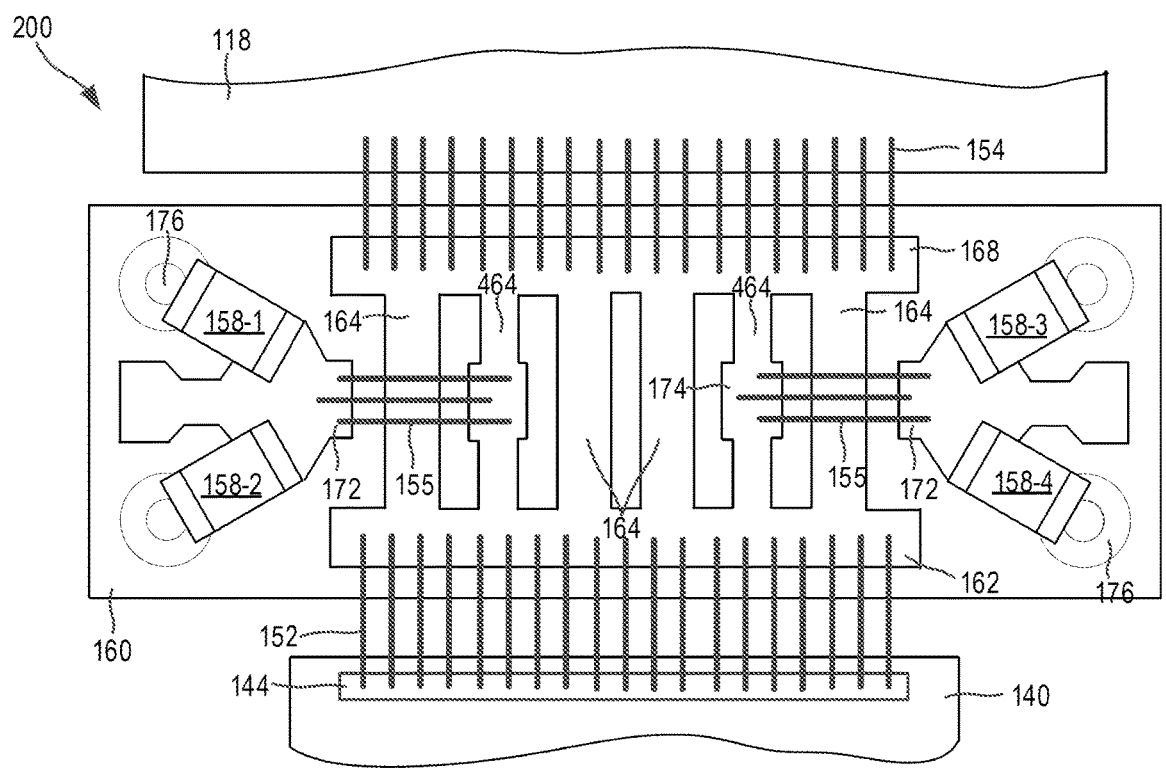
FIGS. 4A-4H are plan views of the output impedance matching networks of RF transistor amplifiers according to further embodiments of the present invention.

FIG. 4A is a plan view of a portion of an RF transistor amplifier 200 according to further embodiments of the present invention. The RF transistor amplifier 200 may be identical to the RF transistor amplifier 100 discussed above except as discussed below.

As shown in FIG. 4A, RF transistor amplifier 200 differs from RF transistor amplifier 100 in that the shunt microstrip transmission lines 166 of RF transistor amplifier 100 are extended in RF transistor amplifier 200 so that they connect to the second bond pad 168. In other words, in RF transistor amplifier 200, the shunt microstrip transmission lines 166 of RF transistor amplifier 100 are converted into additional series microstrip transmission lines 464. Each of the additional series microstrip transmission lines 464 may include a widened area 174 that serves as a bond pad so that ends of the fifth bond wires 155 may be more readily bonded thereto. In RF transistor amplifier 200, the shunt LC circuit to ground comprises portions of the additional series RF transmission lines 464, the fifth bond wires 155 and the capacitors 158.

Figure 4B:
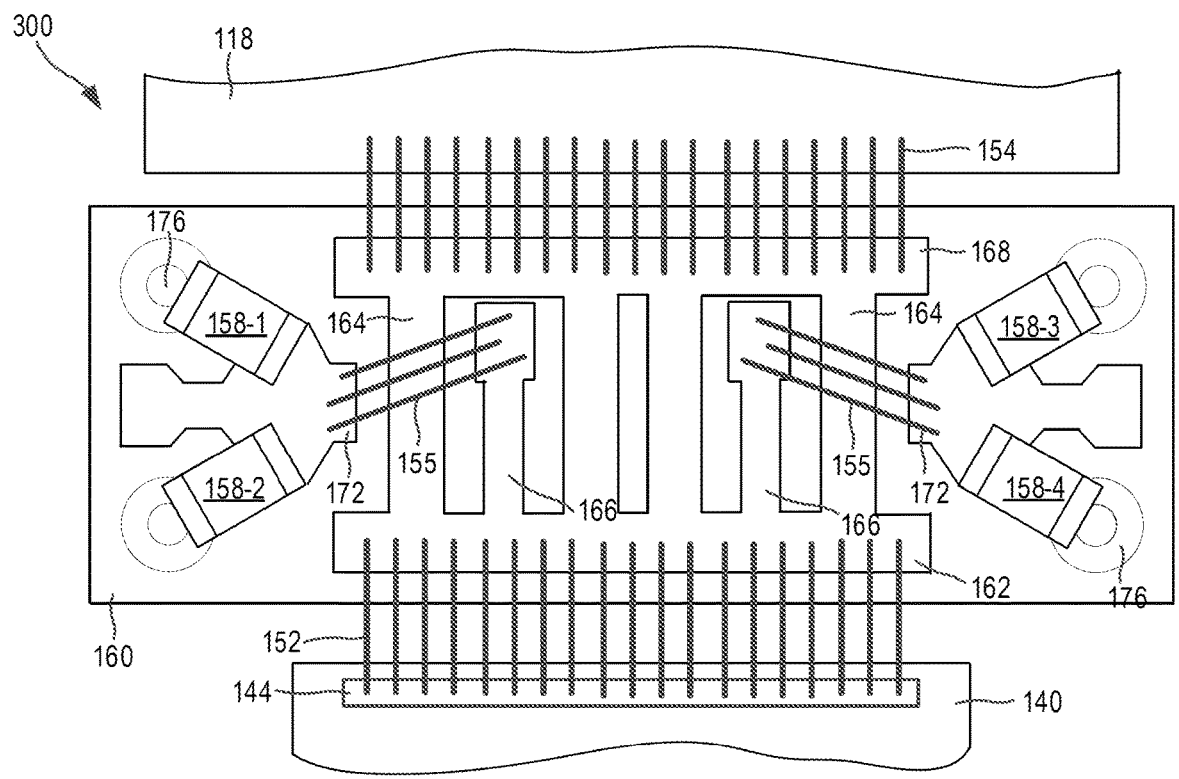

FIG. 4B is a plan view of a portion of an RF transistor amplifier 300 according to further embodiments of the present invention. The RF transistor amplifier 300 may be identical to the RF transistor amplifier 100 discussed above except that the fifth bond wires 155 extend at an angle of about 60° with respect to the third bond wires 152 as opposed to extending at an angle of about 90° as was the case with RF transistor amplifier 100. In some embodiments, the fifth bond wires 155 may extend at an angle of between 45° and 135° with respect to the third bond wires 152.

Figure 4C:
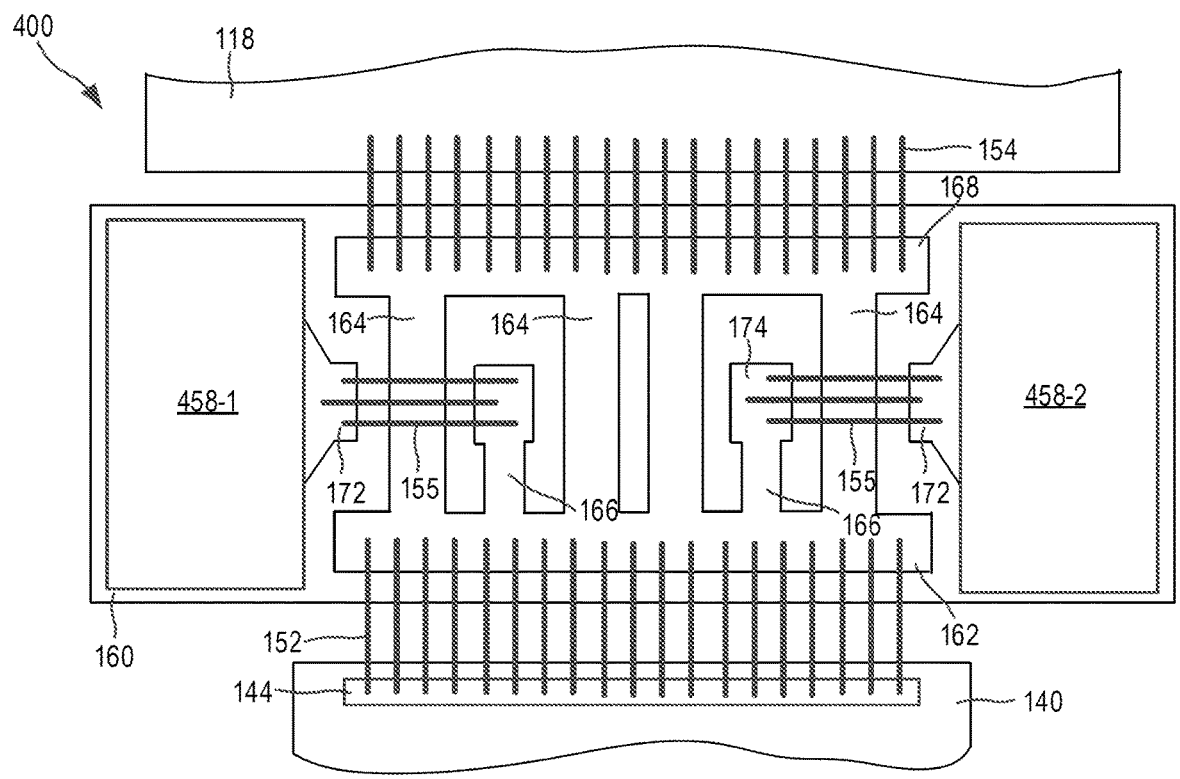

FIG. 4C is a plan view of a portion of an RF transistor amplifier 400 according to further embodiments of the present invention. The RF transistor amplifier 400 may be identical to the RF transistor amplifier 100 discussed above except that the lumped element capacitors 158 of RF transistor amplifier 100 are replaced in RF transistor amplifier 400 with capacitors 458 that are formed integral with the integrated passive device. The capacitors 458 may comprise, for example, silicon-based MOSCAP capacitors or silicon carbide based metal-insulator-metal capacitors. The capacitors 458 may be formed in the integrated passive device 160 as shown, or may be bonded to an upper surface of the integrated passive device 160. The capacitors 458 could alternatively be located to the side of the integrated passive device 160 (e.g., mounted directly on the substrate).

Figure 4D:
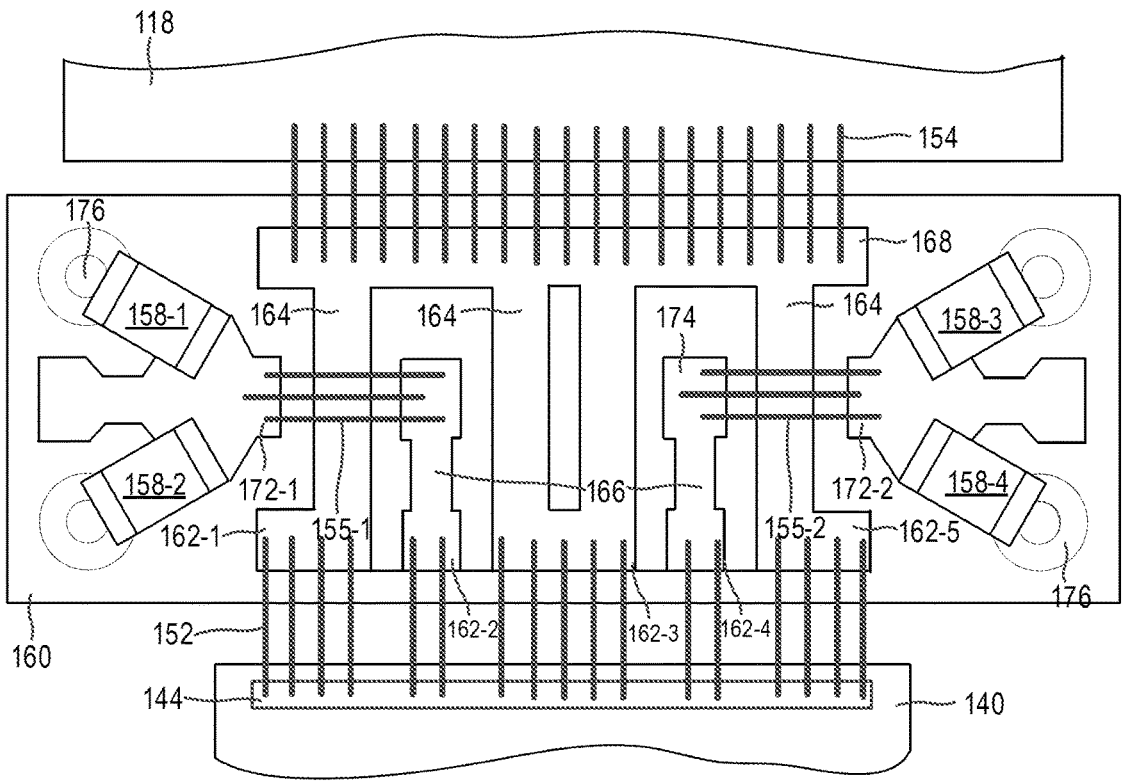

FIG. 4D is a plan view of a portion of an RF transistor amplifier according to still further embodiments of the present invention. The RF transistor amplifier of FIG. 4D is identical to the RF transistor amplifier 100 discussed above except that the first bond pad 162 is divided into a plurality of smaller first bond pads 162-1 through 162-5, and the locations of the third bond wires 152 are modified slightly to align with the smaller first bond pads 162-1 through 162-5. This arrangement may change the distribution of the shunt inductance between the third bond wires 152 and the fifth bond wires 155 (shifting a greater percentage of the total inductance to the third bond wires 152). The number of individual bonds pads 162 may be varied to be more or less than five. Similarly, the second bond pad 168 may be subdivided into appropriate numbers of smaller bond pads in further embodiments.

Figure 4E:
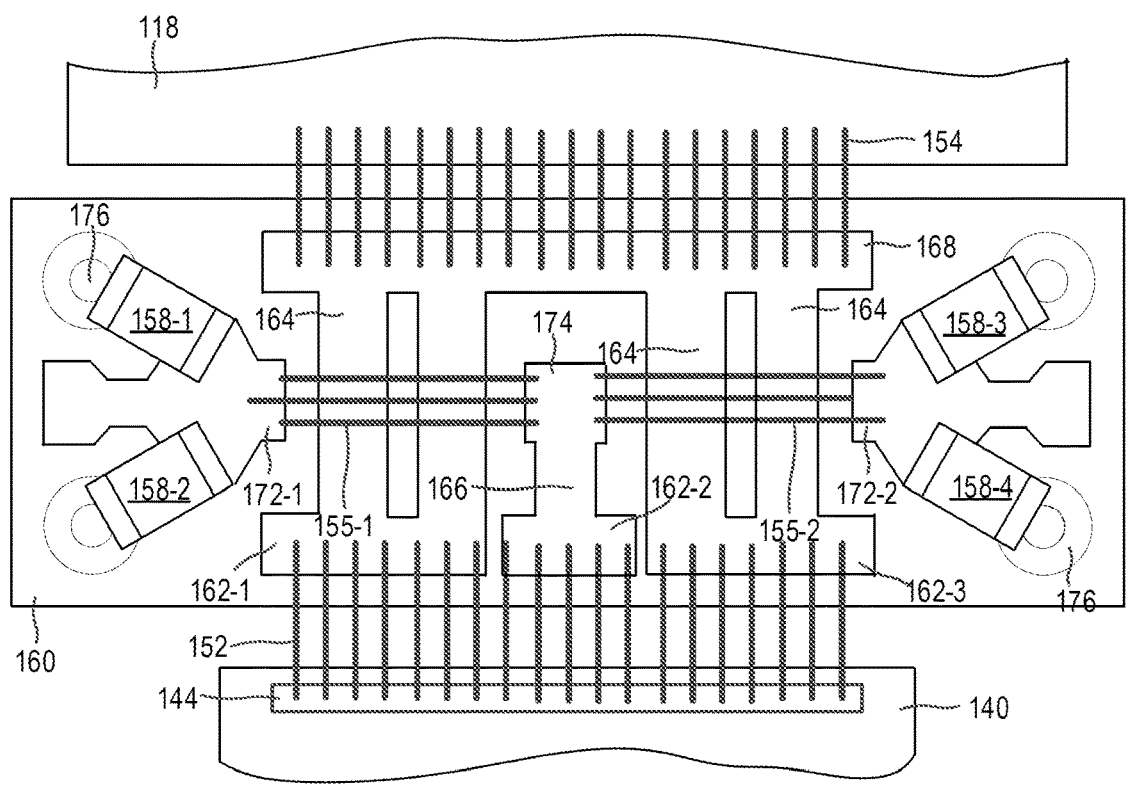

FIG. 4E is a plan view of a portion of an RF transistor amplifier according to additional embodiments of the present invention. The RF transistor amplifier of FIG. 4E is identical to the RF transistor amplifier 100 discussed above except that (1) the RF transistor amplifier of FIG. 4E includes a single shunt RF transmission line 166 (instead of two), which may be helpful when a smaller RF transistor amplifier die 140 is used, and (2) the first bond pad 162 is divided into three smaller first bond pads 162-1 through 162-3. Additionally, since only a single shunt RF transmission line 166 is provided, both sets of fifth bond wires 155 are bonded to the bond pad 174 provided at the end of the shunt RF transmission line 166. It will be appreciated that any appropriate number of series RF transmission lines 164 and shunt RF transmission lines 166 may be used in other embodiments.

Figure 4F:
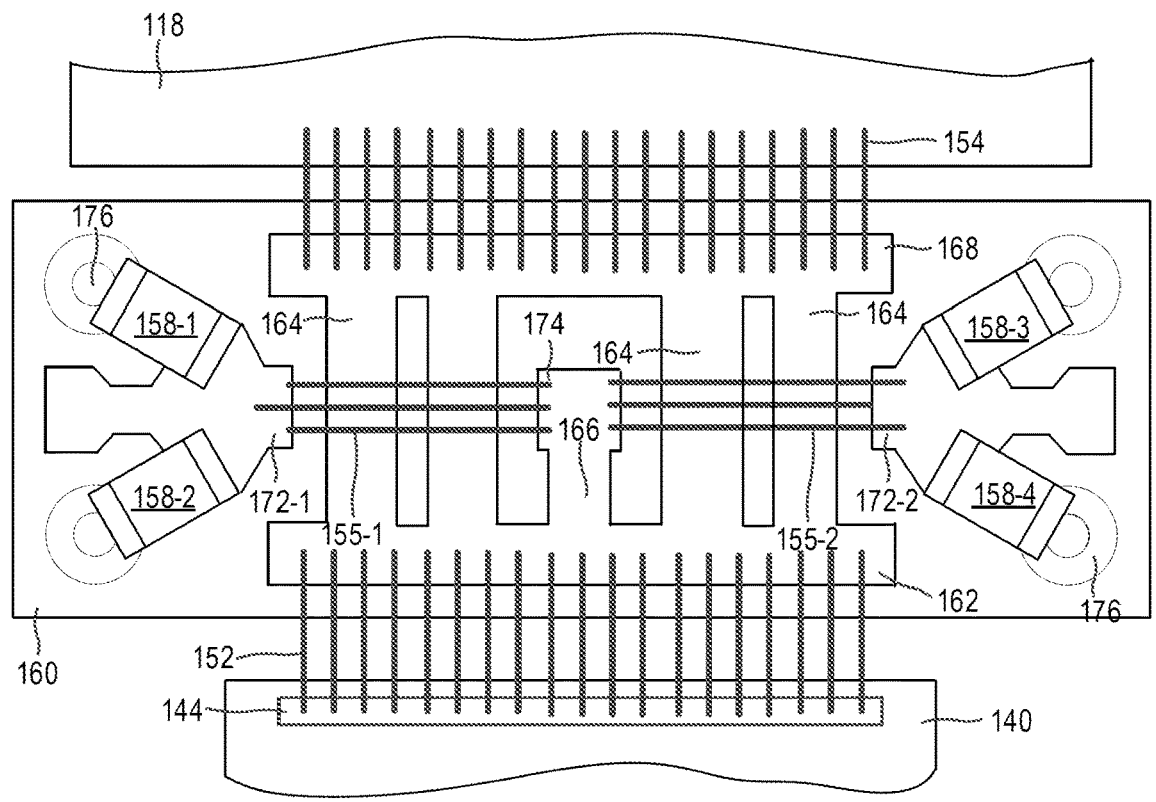

FIG. 4F is a plan view of a portion of an RF transistor amplifier according to still further embodiments of the present invention. The RF transistor amplifier of FIG. 4F is identical to the RF transistor amplifier 100 discussed above except that the RF transistor amplifier of FIG. 4E includes a single shunt RF transmission line 166 (instead of two) and both sets of fifth bond wires 155 are bonded to the bond pad 174 provided at the end of the shunt RF transmission line 166.

Figure 4G:
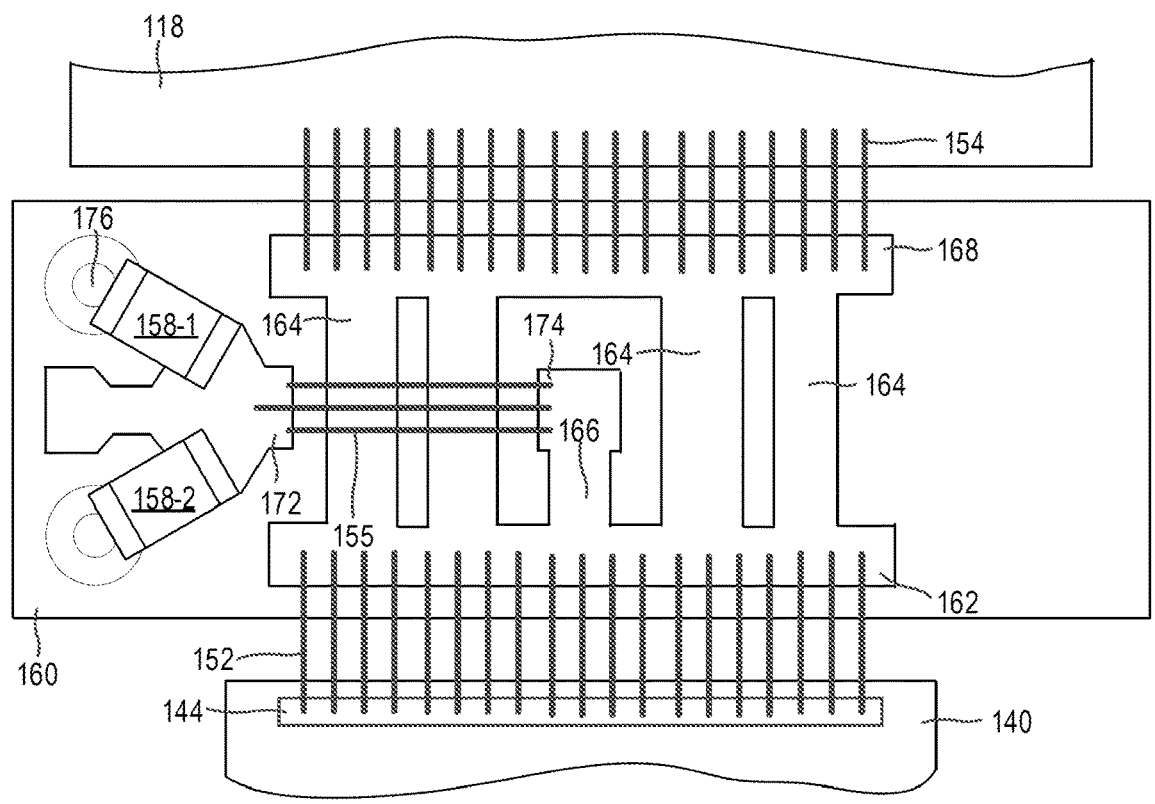

FIG. 4G is a plan view of a portion of an RF transistor amplifier according to yet additional embodiments of the present invention. The RF transistor amplifier of FIG. 4G is identical to the RF transistor amplifier of FIG. 4F discussed above except that only two shunt capacitors 158 are provided (instead of four) and one of the sets of fifth bond wires 155 is omitted. It will be appreciated that similar changes may be made to any of the above-discussed embodiments so that an appropriate amount of capacitance is provided.

Figure 4H:
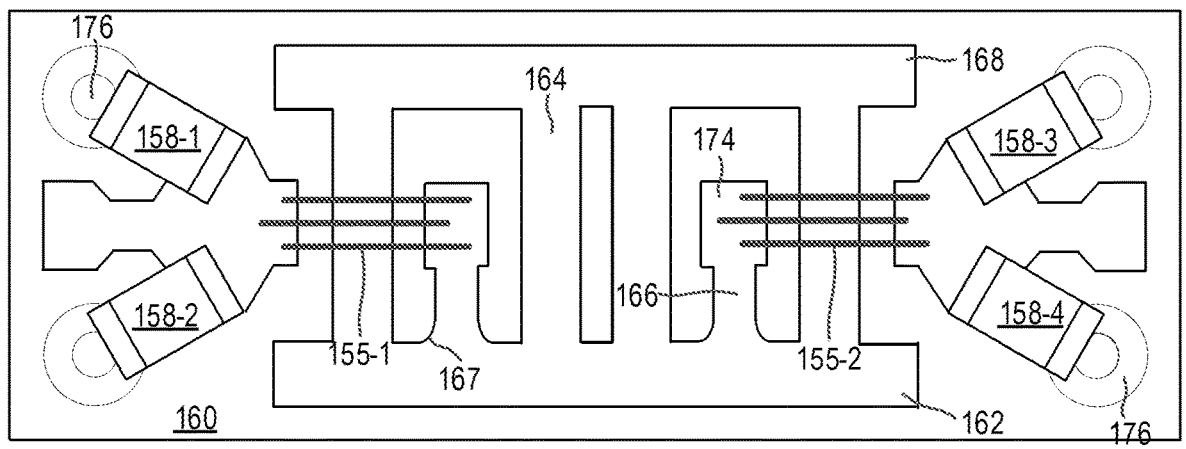

FIG. 4H is a plan view of a portion of an RF transistor amplifier according to still further embodiments of the present invention. The RF transistor amplifier of FIG. 4H is identical to the RF transistor amplifier 100 discussed above except that chamfers are provided at the intersections between the shunt RF transmission lines 166 and the first bond pad 162. Such chamfers may be included in any of the embodiments discussed herein, and may also be provided on the series RF transmission lines 164.

The RF transistor amplifiers according to embodiments of the present invention may have a number of advantages as compared to conventional RF transistor amplifiers.

First, using RF transistor amplifier 100 as an example, the inductance of each separate shunt inductance 152, 166, 155 may be less than the shunt inductance provided by the shunt bond wires 54 of the conventional RF transistor amplifier 1. This means that the sets of third and fifth bond wires 152, 155 in RF transistor amplifier 100 will not run as hot as the bond wires 54 of conventional RF transistor amplifier 1 when the two amplifiers are operated under the same conditions.

Second, since the amount of inductance provided by the sets of third and fifth bond wires 152, 172 may be substantially less than the inductance provided by bond wires 54, the lengths of the third and fifth bond wires 152, 155 may be reduced. In the conventional RF transistor amplifier 1, the bond wires 52 may be relatively long, and hence may extend high above the upper surface of the RF transistor amplifier 1. This may result in increased coupling between bond wires 34 and bond wires 52, which represents an undesired parasitic capacitance (namely, a gate-to-drain capacitance Cgd). Since the bond wires 152, 155 of RF transistor amplifier 100 may be substantially shorter than the bond wires 52 of conventional RF transistor amplifier 1, the coupling, and hence the value of Cgd, may be reduced.

Third, the set of fifth bond wires 155 in RF transistor amplifier 100 are at an increased distance from the input impedance matching network 130 (as compared to the bond wires 54 of RF transistor amplifier 1). This acts to further reduce Cgd. Moreover, as discussed above, the fifth bond wires 155 may be positioned at an angle (e.g., a 90° angle) with respect to the first and second bond wires 132, 134. This may decrease Cgd even further, as the differing current directions on the bond wires 155, 134 further decreases coupling.

Fourth, the RF transistor amplifiers according to embodiments of the present invention may also require fewer total bond wires as compared to the conventional RF transistor amplifier of FIGS. 1A-1B. The bond wires, which may include gold, may be expensive. By implementing some of the necessary inductance using the series and shunt RF transmission lines 164, 166 on the integrated passive device 160, the total amount of bond wire material may be reduced. This may reduce fabrication costs. Thus, the RF transistor amplifier 100 may improve performance and decrease cost in a variety of different ways.

Figure 5A:
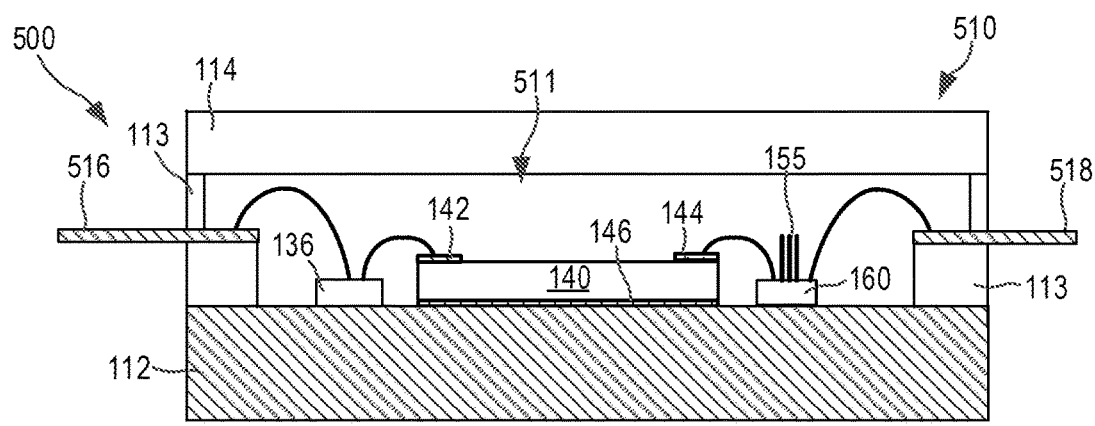
FIG. 5A is a schematic cross-sectional view of a modified version of the RF transistor amplifier of FIGS. 2A-2C that is packaged in a ceramic cavity package.
Figure 5B:
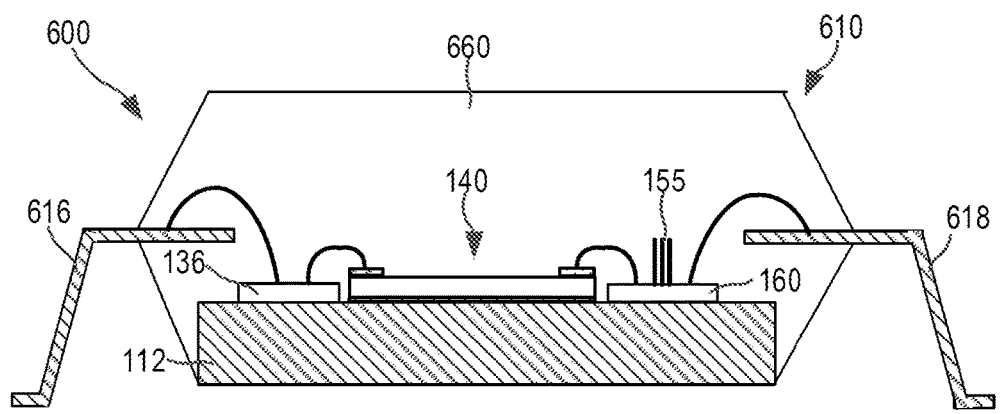
FIG. 5B is a schematic cross-sectional view of a modified version of the RF transistor amplifier of FIGS. 2A-2C that is packaged in overmold package.

The RF transistor amplifier 100 that is discussed above with reference to FIGS. 2A-3B has a ceramic package with a printed circuit board 120 that forms the RF input and output leads 116, 118. It will be appreciated, however, that embodiments of the present invention are not limited thereto. FIGS. 5A and 5B are cross-sectional views of RF transistor amplifiers according to further embodiments of the present invention that employ different package structures. The RF transistor amplifiers in FIGS. 5A and 5B are shown as having the same circuit design as the RF transistor amplifier 100 that is discussed above with reference to FIGS. 2A-3B. It will be appreciated, however, that the circuit components (e.g., the RF transistor amplifier die and the input and output impedance matching networks) of any of the above-described RF transistor amplifiers may be packaged in the packages shown in FIGS. 5A and 5B. In other words, FIGS. 2C, 5A and 5B illustrate three example packages which may be used to package any of the RF transistor amplifiers according to embodiments of the present invention that are disclosed herein.

Referring first to FIG. 5A, an RF transistor amplifier 500 is illustrated (in cross-sectional view) that is packaged in a ceramic cavity package 510. As shown in FIG. 5A, packaged RF transistor amplifier 500 includes the RF transistor amplifier die 140 packaged in an open cavity package 510. The package 510 includes a metal submount 112, sidewalls 113, a lid 114, one or more metal gate leads 516, and one or more metal drain leads 518. The submount 112, sidewalls 113 and lid 114 may be identical or similar to the correspondingly numbered submount, sidewalls and lid of RF transistor amplifier 100. Accordingly, further description of these elements of the package 510 will be omitted.

The RF transistor amplifier die 140 is mounted on the upper surface of the metal submount 112 in an air-filled cavity 511 defined by the metal submount 112, the ceramic sidewalls 113 and the ceramic lid 114. The gate and drain terminals 142, 144 of RF transistor amplifier die 140 are on the top side of the die 140, while a source terminal 146 of the device is on the bottom side of the die 140. The source terminal 146 may be mounted on the metal submount 112 using, for example, a conductive die attach material (not shown). The metal submount 112 may provide the electrical connection to the source terminal 112 and may also serve as a heat dissipation structure that dissipates heat that is generated in the RF transistor amplifier die 140. The heat is primarily generated in the upper portion of the RF transistor amplifier die 140 where relatively high current densities are generated in, for example, the channel regions of the unit cell transistors. This heat may be transferred though source vias (described below) and the semiconductor layer structure of the die 140 to the source terminal 146 and then to the metal submount 112.

The RF input lead 516 (i.e., the gate lead) and the RF output lead 518 (i.e., the drain lead) may be implemented as metal leads that may, for example, be captured between the sidewall structure 113 and the lid 114. These metal leads 516, 518 are used in place of the printed circuit based leads 116, 118 included in RF transistor amplifier 100. As the remainder of RF transistor amplifier 500 may be identical to RF transistor amplifier 100, further description thereof will be omitted.

FIG. 5B is a schematic cross-sectional view of another packaged RF transistor amplifier 600. RF transistor amplifier 600 differs from RF transistor amplifier 100 in that it includes a different package 610. The package 610 includes a metal submount 112 (which may be similar or identical to the like numbered submount 112 of package 110), as well as metal gate and drain leads 616, 618. RF transistor amplifier 600 also includes a plastic overmold 660 that at least partially surrounds the RF transistor amplifier die 140, the leads 616, 618, and the metal submount 112. Other components of RF transistor amplifier 600 may be the same as the like-numbered components of RF transistor amplifier 100 and hence further description thereof will be omitted.

Figure 6A:
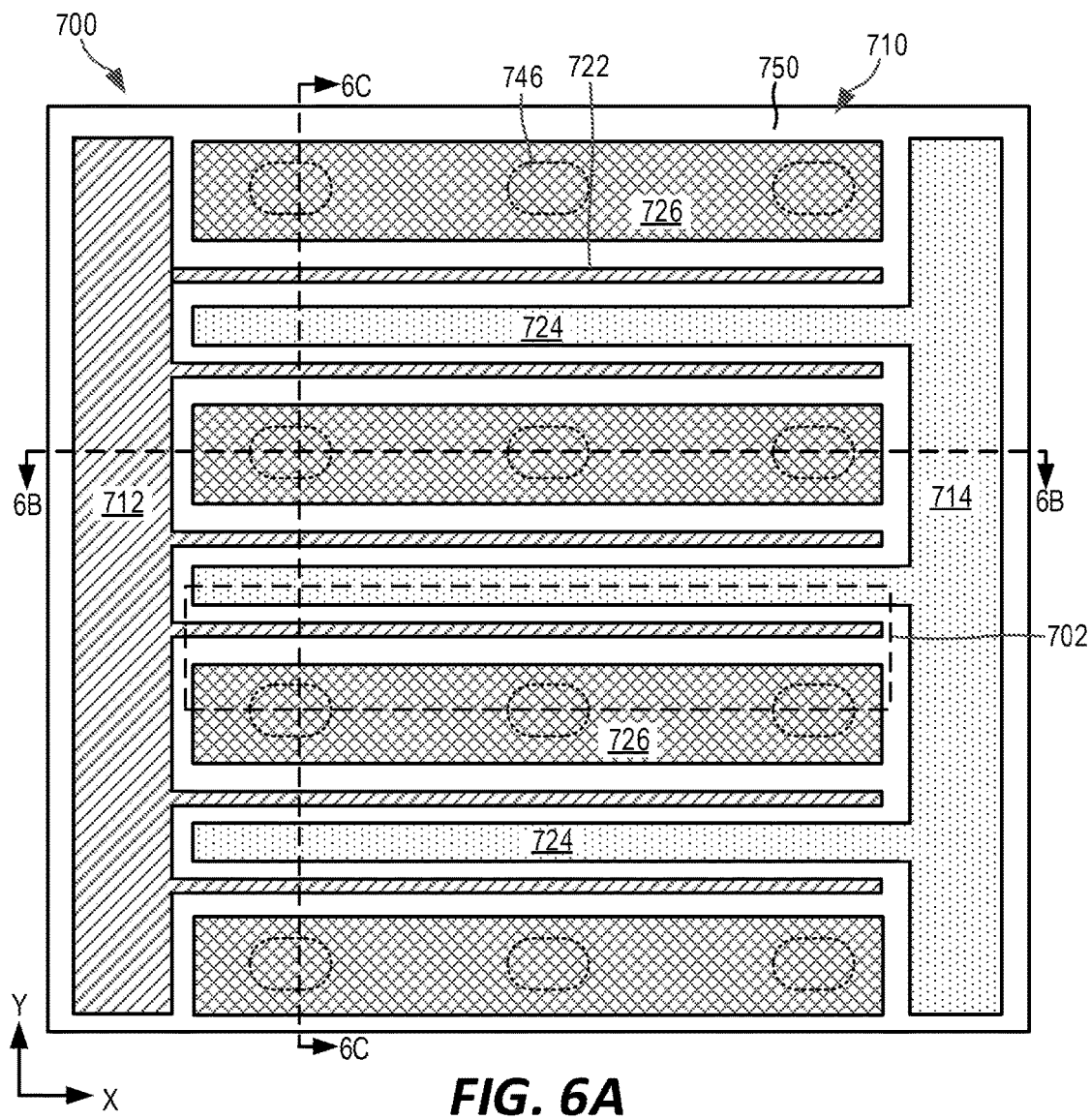
FIG. 6A is a schematic plan view of a Group III nitride-based RF transistor amplifier die that may be used in the packaged RF transistor amplifiers according to embodiments of the present invention that illustrates the metallization that is on the top surface of the semiconductor layer structure thereof.
Figure 6B:
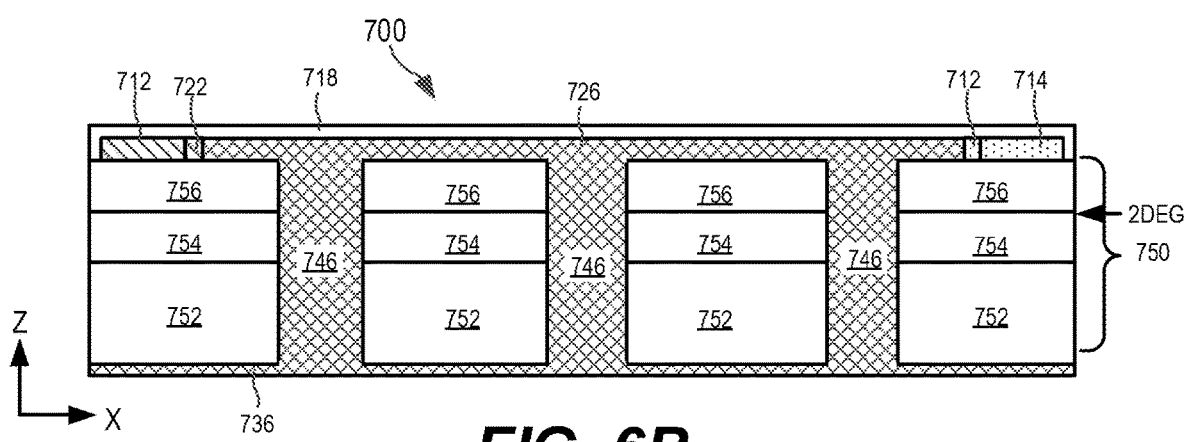
FIG. 6B is a schematic cross-sectional view taken along line 6B-6B of FIG. 6A.
Figure 6C:
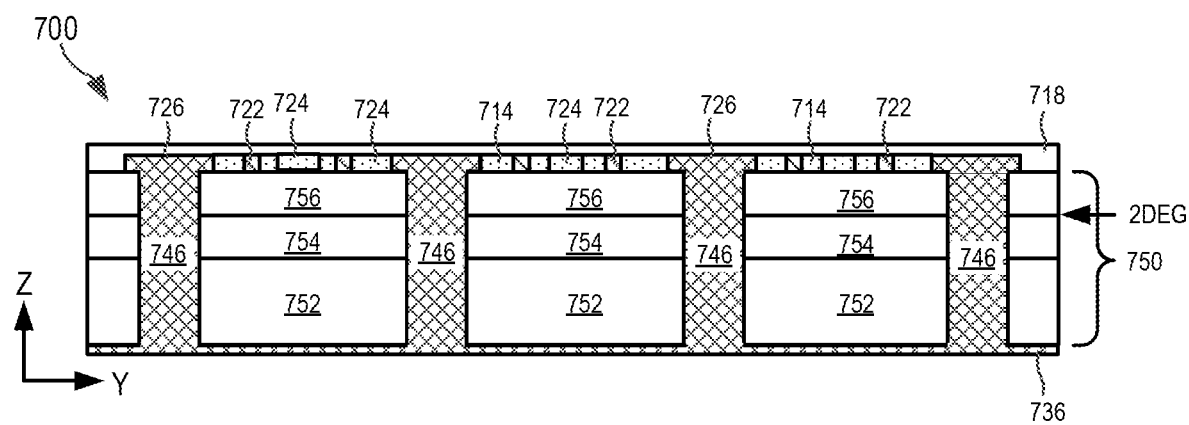
FIG. 6C is a schematic cross-sectional view taken along line 6C-6C of FIG. 6A.

FIGS. 6A through 6C are various views that schematically illustrate a Group III nitride-based RF transistor amplifier die 700 that may be used as the RF transistor amplifier die 140 in any of the RF transistor amplifiers according to embodiments of the present invention. In particular, FIG. 6A is a schematic plan view of the RF transistor amplifier die 700. In FIG. 6A, most of the metallization that is on the top surface of the semiconductor layer structure has been removed to illustrate the metallization that directly contacts the semiconductor layer structure of RF transistor amplifier die 700. FIGS. 6B and 6C are schematic cross-sectional views of the RF transistor amplifier die 700 taken along lines 6B-6B and 6C-6C of FIG. 6A, respectively. It will be appreciated that FIGS. 6A-6C are highly simplified diagrams, and that actual RF transistor amplifiers may include many more unit cells and various circuitry and elements that are not shown in the simplified figures herein.

As shown in FIG. 6A, the RF transistor amplifier die 700 includes a top side metallization structure 710 that is formed on a semiconductor layer structure 750. The top side metallization structure 710 includes a gate bus 712 and a drain bus 714, a plurality of gate fingers 722, a plurality of drain fingers 724 and a plurality of source fingers 726, all of which are formed on an upper surface of the semiconductor layer structure 750. The gate fingers 722, drain fingers 724 and source fingers 726 may extend in parallel to each other, with the gate fingers 722 extending from the gate bus 712 in a first direction and the drain fingers 724 extending from the drain bus 714 in a direction opposite the first direction. Each gate finger 722 may be positioned between a drain finger 714 and a source finger 726.

The gate bus 712 and the gate fingers 722 may be implemented as a first monolithic metal pattern. The gate fingers 722 may be formed of materials that are capable of making a Schottky contact to a Group III nitride-based semiconductor material, such as Ni, Pt, Cu, Pd, Cr, W and/or WSiN. The gate bus 712 and the gate fingers 722 are part of a gate electrode structure of the RF transistor amplifier die 700. The upper portion (not shown) of the gate electrode may act as the gate terminal of the RF transistor amplifier die 700. A first circuit element (not shown) may be connected to the gate terminal by, for example, bond wires (not shown). The first circuit element may pass an input RF signal that is to be amplified to the RF transistor amplifier die 700.

The drain bus 714 and the drain fingers 724 may be implemented as a second monolithic metal pattern. The drain fingers 724 may include a metal, such as TiAlN, that can form an ohmic contact to Group III nitride-based materials. The drain bus 714 and the drain fingers 724 are part of a drain electrode of the RF transistor amplifier die 700. The upper portion (not shown) of the drain electrode may act as a drain terminal of the RF transistor amplifier die 700. A second circuit element (not shown) may be connected to the drain terminal by, for example, bond wires (not shown). The second circuit element may receive an amplified RF signal that is output by the RF transistor amplifier die 700.

The source fingers 726 may include a metal, such as TiAlN, that can form an ohmic contact to Group III nitride-based materials. The source fingers 726 are physically and electrically connected to a source terminal 736 (see element 146 of FIG. 2C) of the RF transistor amplifier die 700 that is located on the bottom side of the semiconductor layer structure 750 by a plurality of metal-plated source vias 746. Each metal-plated source via 746 may extend from the top metallization structure 710 through the semiconductor layer structure 750. Each metal-plated source via 746 may each be implemented by forming openings though the semiconductor layer structure 750 (e.g., by anisotropic etching) and by then depositing metal-plating that coats the sidewalls of the openings (and may optionally fill the openings).

One or more interlayer insulating layers 718 (see FIG. 6B) are formed that isolate the gate metallization 712, 722, the drain metallization 714, 724 and the source metallization 726 from each other. The interlayer insulating layer(s) 718 may include a dielectric material, such as SiN, SiO$_2$, etc.

The RF transistor amplifier die 700 includes a plurality of unit cell transistors 702, one of which is indicated in the dashed box in FIG. 6A. The unit cell transistor 702 includes a gate finger 722, a portion of a drain finger 724 and a portion of a source finger 726 along with the portions of the semiconductor layer structure 750 underlying the identified gate finger 722, drain finger 724 and source finger 726. Since all of the gate fingers 722 are electrically connected to a common gate bus 712, all of the drain fingers 724 are electrically connected to a common drain bus 714, and all of the source fingers 726 are electrically connected to a common source terminal 736, it can be seen that the unit cell transistors 702 are all electrically connected together in parallel. The RF transistor amplifier die 700 may comprise a Group III nitride-based HEMT RF transistor amplifier.

FIGS. 6B and 6C illustrate the semiconductor layer structure 750 in more detail. As shown in FIGS. 6B and 6C, the semiconductor layer structure 750 includes a plurality of semiconductor layers. In the depicted embodiment, a total of two semiconductor layers are shown, namely a channel layer 754 and a barrier layer 756 that is on a top side of the channel layer 754. The semiconductor layer structure 750 may (and typically will) include additional semiconductor and/or non-semiconductor layers. For example, the semiconductor layer structure 750 may include a growth substrate 752 on which the other semiconductor layers are grown. The growth substrate 752 may comprise, for example, a 4H-SiC or 6H-SiC substrate. In other embodiments, the growth substrate 752 may be comprise a different semiconductor material (e.g., silicon or a Group III nitride-based material, GaAs, ZnO, InP) or a non-semiconductor material (e.g., sapphire). The growth substrate 752, even if formed of a non-semiconductor material, is considered to be part of the semiconductor layer structure 750.

Optional buffer, nucleation and/or transition layers (not shown) may be provided on the growth substrate 752 beneath the channel layer 754. For example, an AlN buffer layer may be included to provide an appropriate crystal structure transition between a SiC growth substrate 752 and the remainder of the semiconductor layer structure 750. Additionally, strain balancing transition layer(s) may also be provided.

In some embodiments, the channel layer 754 is a Group III nitride material, such as $Al_xGa_{1-x}N$ where $0 \leq x < 1$, provided that the energy of the conduction band edge of the channel layer 754 is less than the energy of the conduction band edge of the barrier layer 756 at the interface between the channel and barrier layers 754, 756. In certain embodiments of the present invention, x=0, indicating that the channel layer 754 is gallium nitride ("GaN"). The channel layer 754 may also be other Group III nitrides such as InGaN, AlInGaN or the like. The channel layer 754 may be undoped or unintentionally doped and may be grown to a thickness of, for example, greater than about 20 Å. The channel layer 754 may also be a multi-layer structure, such as a superlattice or combinations of GaN, AlGaN or the like.

The channel layer 754 may have a bandgap that is less than the bandgap of at least a portion of the barrier layer 756, and the channel layer 754 may also have a larger electron affinity than the barrier layer 756. In certain embodiments, the barrier layer 756 is AlN, AlInN, AlGaN or AlInGaN with a thickness of between about 0.1 nm and about 10 nm or more. In particular embodiments, the barrier layer 756 is thick enough and has a high enough Al composition and doping to induce a significant carrier concentration at the interface between the channel layer 754 and the barrier layer 756.

The barrier layer 756 may be a Group III nitride and may have a bandgap larger than that of the channel layer 754 and a smaller electron affinity than the channel layer 754. Accordingly, in certain embodiments of the present invention, the barrier layer 756 may include AlGaN, AlInGaN and/or AlN or combinations of layers thereof. The barrier layer 756 may, for example, be from about 0.1 nm to about 30 nm thick. In certain embodiments, the barrier layer 756 is undoped or doped with an n-type dopant to a concentration less than about $10^{19}$ cm$^{-3}$. In some embodiments, the barrier layer 756 is Al$_x$Ga$_{1-x}$N where 0<x<1. In particular embodiments, the aluminum concentration is about 25%. However, in other embodiments of the present invention, the barrier layer 756 comprises AlGaN with an aluminum concentration of between about 5% and about 100%.

Due to the difference in bandgap between the barrier layer 756 and the channel layer 754 and piezoelectric effects at the interface between the barrier layer 756 and the channel layer 754, a two dimensional electron gas (2DEG) is induced in the channel layer 754 at a junction between the channel layer 754 and the barrier layer 756. The 2DEG acts as a highly conductive layer that allows conduction between the source region of each unit cell transistor 702 and its associated drain region, where the source region is the portion of the semiconductor layer structure 750 that is directly underneath the source finger 726 and the drain region is the portion of the semiconductor layer structure 750 that is directly underneath the corresponding drain finger 724.

The RF transistor amplifiers described above can be used as standalone RF transistor amplifiers. They may also be used in various applications that include multiple RF transistor amplifiers. Examples of how the RF transistor amplifiers according to embodiments of the present invention may be used in applications that include multiple amplifiers will be discussed with reference to FIGS. 7A through 7C.

Figure 7A:
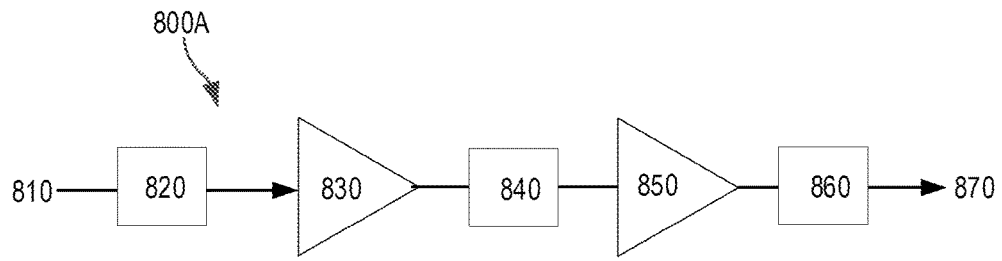
FIGS. 7A-7C are schematic block diagrams of multi-amplifier RF transistor amplifiers according to further embodiments of the present invention.

Referring first to FIG. 7A, an RF transistor amplifier 800A is schematically illustrated that includes a pre-amplifier 830 and a main amplifier 850 that are electrically connected in series. As shown in FIG. 7A, RF transistor amplifier 800A includes an RF input 810, an input impedance matching network 820, the pre-amplifier 830, an inter-stage impedance matching network 840, the main amplifier 850, an output impedance matching network 860 and an RF output 870. The RF transistor amplifier 800A is similar to RF transistor amplifier 100, but further includes an extra RF transistor amplifier die (e.g., the pre-amplifier 830) and an extra impedance matching network (e.g., inter-stage impedance matching network 840). Thus, it will be appreciated that any of the RF transistor amplifiers disclosed herein may further include a pre-amplifier and an inter-stage impedance matching network.

Figure 7B:
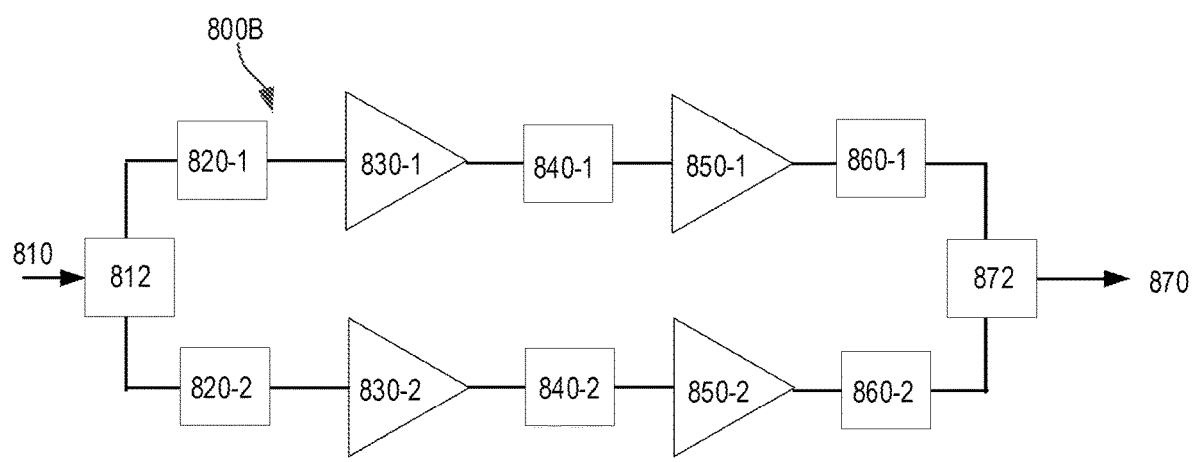

Referring to FIG. 7B, an RF transistor amplifier 800B is schematically illustrated that includes an RF input 810, a pair of input impedance matching networks 820-1, 820-2, a pair of pre-amplifiers 830-1, 830-2, a pair of inter-stage impedance matching networks 840-1, 840-2, a pair of main amplifiers 850-1, 850-2, a pair of output impedance matching networks 860-1, 860-2, and an RF output 870. A splitter 812 and a combiner 872 are also provided. Pre-amplifier 830-1 and main amplifier 850-1 (which are electrically connected in series) are arranged electrically in parallel with pre-amplifier 830-2 and main amplifier 850-2 (which are electrically connected in series). Each of these four amplifiers may be implemented using a separate RF transistor amplifier die. Any of the RF transistor amplifiers disclosed herein may be modified to have the multi-amplifier design shown in FIG. 7B.

Figure 7C:
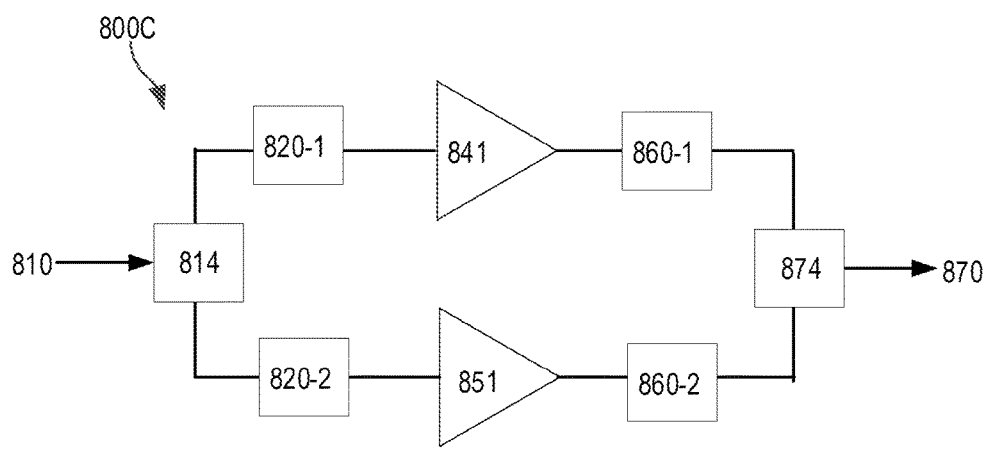

As shown in FIG. 7C, the RF transistor amplifiers according to embodiments of the present invention may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 7C, the Doherty RF transistor amplifier 800C includes an RF input 810, an input splitter 814, a pair of input impedance matching networks 820-1, 820-2, a main amplifier 841, a peaking amplifier 851, a pair of output impedance matching networks 860-1, 860-2, an output combiner 874 and an RF output 870. Any of the RF transistor amplifiers disclosed herein may be modified to have the Doherty amplifier design shown in FIG. 7C.

Although embodiments of the present invention have been discussed above with respect to a RF transistor amplifier dies that are implemented using HEMT devices, it will be understood that other types of semiconductor devices may be formed in the semiconductor layer structure without deviating from the present invention. For example, the semiconductor layer structure may include a MOSFET, a DMOS transistor, a MESFET, and/or an LDMOS transistor in other embodiments.

Embodiments of the present inventive concepts have been described above with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

In the specification and the figures, two-part reference numbers (i.e., two numbers separated by a dash) may be used to identify like elements. When such two-part reference numbers are employed, the full reference numeral may be used to refer to a specific instance of the element, while the first part of the reference numeral may be used to refer to the elements collectively.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A packaged radio frequency ("RF") transistor amplifier, comprising:
   an RF transistor amplifier die having a first terminal and a second terminal;
   a first lead;
   a second lead;
   an integrated passive device that includes a first series microstrip transmission line;
   a first bond wire coupled between the first terminal and the first series microstrip transmission line; and
   a second bond wire coupled between the first series microstrip transmission line and the first lead, and
   an electrical connection between the second lead and the second terminal,
   wherein the integrated passive device is interposed between the RF transistor amplifier die and the first lead, and
   wherein the first lead comprises an output lead.

2. The packaged RF transistor amplifier of claim 1, wherein the first bond wire, the first series microstrip transmission line and the second bond wire comprise an electrical path between the first terminal and the first lead.

3. The packaged RF transistor amplifier of claim 1, further comprising a shunt inductor-capacitor ("LC") circuit electrically connected between a bond pad on the integrated passive device and electrical ground.

4. The packaged RF transistor amplifier of claim 3, wherein the integrated passive device further includes a first shunt microstrip transmission line that is part of the shunt LC circuit.

5. The packaged RF transistor amplifier of claim 1, wherein the integrated passive device further includes a capacitor that is part of the shunt LC circuit.

6. The packaged RF transistor amplifier of claim 5, further comprising a third bond wire that is electrically coupled in series with the first shunt microstrip transmission line.

7. The packaged RF transistor amplifier of claim 6, wherein the first bond wire extends in a first direction and the third bond wire extends in a third direction that forms an oblique angle with the first direction.

8. The packaged RF transistor amplifier of claim 6, wherein the third bond wire crosses over the first series microstrip transmission line when the packaged RF transistor amplifier is viewed along an axis that extends perpendicular to an upper surface of the integrated passive device.

9. The packaged RF transistor amplifier of claim 1, wherein the integrated passive device further includes a first shunt microstrip transmission line that is coupled between the first terminal and electrical ground.

10. The packaged RF transistor amplifier of claim 9, wherein the integrated passive device further includes a second series microstrip transmission line, and wherein the first shunt microstrip transmission line is between the first series microstrip transmission line and the second series microstrip transmission line.

11. A packaged radio frequency ("RF") transistor amplifier, comprising:
    an RF transistor amplifier die having a first terminal;
    a first lead;
    a capacitor having a first electrode and a second electrode;
    an integrated passive device that includes a first series transmission line that forms part of an electrical path between the first terminal and the first lead and a first shunt microstrip transmission line that is electrically coupled between the first terminal and the first electrode of the capacitor; and
    a package,
    wherein the RF transistor amplifier die and the integrated passive device are within the package, and the first lead extends from an interior of the package to outside the package.

12. The packaged RF transistor amplifier of claim 11, wherein the electrical path further comprises a first bond wire that couples the first terminal to the first series transmission line and a second bond wire that couples the first series transmission line to the first lead.

13. The packaged RF transistor amplifier of claim 12, wherein the second electrode is coupled to electrical ground.

14. The packaged RF transistor amplifier of claim 13, further comprising a third bond wire that is electrically coupled in series with the first shunt microstrip transmission line.

15. The packaged RF transistor amplifier of claim 14, wherein the first bond wire extends in a first direction and the third bond wire extends in a third direction that forms an oblique angle with the first direction.

16. The packaged RF transistor amplifier of claim 14, wherein the third bond wire crosses over the first series microstrip transmission line when the packaged RF transistor amplifier is viewed along an axis that extends perpendicular to an upper surface of the integrated passive device.

17. The packaged RF transistor amplifier of claim 11, wherein the first series microstrip transmission line is a first of a plurality of series microstrip transmission lines included in the integrated passive device, and wherein the first shunt microstrip transmission line is interposed between two of the series microstrip transmission lines.

18. The packaged RF transistor amplifier of claim 11, wherein the first lead comprises an output lead, and the first terminal comprises a drain terminal, and the capacitor is mounted on the integrated passive device.

19. A packaged radio frequency ("RF") transistor amplifier, comprising:
   an RF transistor amplifier die having a first terminal;
   a first lead;
   an integrated passive device that is interposed between the RF transistor amplifier die and the first lead;
   a first bond wire that extends between the first terminal and the integrated passive device; and
   a third bond wire that has first and second ends that are mounted on the integrated passive device,
   wherein the first bond wire extends in a first direction and the third bond wire extends in a third direction that forms an oblique angle with the first direction.

20. The packaged RF transistor amplifier of claim 19, wherein the integrated passive device further includes a first shunt microstrip transmission line that is coupled to the third bond wire.

21. The packaged RF transistor amplifier of claim 1, wherein the first lead comprises an output lead and the first terminal comprises a drain terminal.

22. The packaged RF transistor amplifier of claim 19, wherein the first lead comprises an output lead and the first terminal comprises a drain terminal.

23. The packaged RF transistor amplifier of claim 19, wherein the integrated passive device includes a first series microstrip transmission line.

* * * * *